United States Patent
Friedman et al.

(10) Patent No.: US 10,424,458 B2
(45) Date of Patent: Sep. 24, 2019

(54) ELECTRON REFLECTOMETER AND PROCESS FOR PERFORMING SHAPE METROLOGY

(71) Applicant: Government of the United States of America, as represented by the Secretary of Commerce, Gaithersburg, MD (US)

(72) Inventors: Lawrence H. Friedman, Silver Spring, MD (US); Wen-Li Wu, Gaithersburg, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 0 days.

(21) Appl. No.: 15/980,399

(22) Filed: May 15, 2018

(65) Prior Publication Data

US 2019/0057834 A1    Feb. 21, 2019

Related U.S. Application Data

(60) Provisional application No. 62/547,937, filed on Aug. 21, 2017.

(51) Int. Cl.

| | | |
|---|---|---|
| H01J 37/147 | (2006.01) | |
| H01J 37/20  | (2006.01) | |
| G01B 15/04  | (2006.01) | |
| H01J 37/06  | (2006.01) | |
| H01J 37/10  | (2006.01) | |
| H01J 37/22  | (2006.01) | |

(52) U.S. Cl.
CPC .......... *H01J 37/1471* (2013.01); *G01B 15/04* (2013.01); *H01J 37/06* (2013.01); *H01J 37/10* (2013.01); *H01J 37/20* (2013.01); *H01J 37/22* (2013.01); *G01B 2210/56* (2013.01)

(58) Field of Classification Search
USPC ...................................... 250/306, 307, 310
See application file for complete search history.

(56) References Cited

U.S. PATENT DOCUMENTS

| | | | |
|---|---|---|---|
| 4,998,788 | A  | 3/1991  | Osakabe et al. |
| 5,093,573 | A  | 3/1992  | Mikoshiba et al. |
| 5,122,222 | A  | 6/1992  | Turner et al. |
| 5,238,525 | A  | 8/1993  | Turner et al. |
| 5,675,148 | A  | 10/1997 | Marui |
| 6,492,644 | B1 | 12/2002 | Staib |
| 6,841,777 | B2 | 1/2005  | Staib |
| 2015/0340201 | A1* | 11/2015 | Wu ........................ H01J 37/29 250/307 |

OTHER PUBLICATIONS

Henzler, M., "Leed Studies of Surface Imperfections", Applications of Surface Science, 1982, 450-469.

* cited by examiner

*Primary Examiner* — Kiet T Nguyen
(74) *Attorney, Agent, or Firm* — Office of Chief Counsel for National Institute of Standards and Technology

(57) ABSTRACT

An electron reflectometer includes: a sample stage; a source that produces source electrons; a source collimator; and an electron detector that receives collimated reflected electrons.

17 Claims, 29 Drawing Sheets

ELECTRON REFLECTOMETER AND PROCESS FOR PERFORMING SHAPE METROLOGY

CROSS REFERENCE TO RELATED APPLICATIONS

This application claims the benefit of U.S. Provisional Patent Application Ser. No. 62/547,937, filed Aug. 21, 2017, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Ser. No. 17-980,399.

BRIEF DESCRIPTION

Disclosed is an electron reflectometer comprising: a sample stage that: receives a sample comprising a sample surface; disposes the sample in a position to be analyzed; moves the sample surface to be positioned perpendicular to an azimuthal axis and coincident at a point of common intersection of a pitch axis pseudo-periodic, roll axis pseudo-periodic, and azimuthal axis pseudo-periodic; provides a pitch rotation pseudo-periodic through a pitch angle pseudo-periodic to the sample about a pitch axis pseudo-periodic; provides a roll rotation pseudo-periodic through a roll angle pseudo-periodic to the sample about a roll axis pseudo-periodic, the pitch axis pseudo-periodic being perpendicular to and independent of the roll axis; and provides an azimuthal rotation pseudo-periodic through an azimuthal angle pseudo-periodic to the sample about an azimuthal axis pseudo-periodic, such that the sample can be rotated into a measurement position; a source pseudo-periodic moveably disposed at an incident angle pseudo-periodic with respect to the sample stage pseudo-periodic and that produces source electrons pseudo-periodic directed toward the sample; a source collimator pseudo-periodic interposed between the source and the sample stage pseudo-periodic sample pseudo-periodic and that: receives the source electrons pseudo-periodic; collimates the source electrons pseudo-periodic; and produces incident electrons pseudo-periodic from the source electrons pseudo-periodic in response to collimating the source electrons pseudo-periodic, the source collimator comprising an electron lens pseudo-periodic and source transmission aperture pseudo-periodic having an incident angular width pseudo-periodic from 0.pseudo-periodic° to 5° and that provides incident electrons pseudo-periodic along an incident direction pseudo-periodic at incident angle pseudo-periodic providing an incident footprint pseudo-periodic of impinging electrons on sample surface pseudo-periodic at the point of common intersection with pitch axis pseudo-periodic, roll axis pseudo-periodic and azimuthal axis pseudo-periodic, with incident angle pseudo-periodic being adjustable from 0° to 5° relative to the plane through the pitch axis pseudo-periodic and the roll axis and incident footprint having length and width controllable via source collimator; a detection collimator pseudo-periodic disposed at a detection angle pseudo-periodic with respect to the sample stage pseudo-periodic and that: receives reflected electrons pseudo-periodic that are reflected by the sample and produced from the incident electrons pseudo-periodic; collimates the reflected electrons pseudo-periodic; and produces collimated reflected electrons pseudo-periodic from the reflected electrons pseudo-periodic in response to collimating the reflected electrons pseudo-periodic, the detection collimator pseudo-periodic comprising a detection transmission aperture pseudo-periodic having a detection angular width pseudo-periodic from 0.pseudo-periodic° to 5°, and the detection angle being adjustable from 0° to 5° relative to a plane through the pitch axis pseudo-periodic and the roll axis; and an electron detector pseudo-periodic that receives the collimated reflected electrons pseudo-periodic, the electron detector pseudo-periodic being disposed at the detection angle and with the detection collimator pseudo-periodic interposed between the sample stage pseudo-periodic and the electron detector pseudo-periodic.

Also disclosed is a process for performing shape metrology of a sample pseudo-periodic, the process comprising: producing the source electrons pseudo-periodic; receiving, by the source collimator, the source electrons from the source; collimating, by the source collimator, the source electrons; producing, by the source collimator, the incident electrons pseudo-periodic from the source electrons; subjecting the sample disposed on the sample stage pseudo-periodic to the incident electrons pseudo-periodic from the source collimator with electrons impinging upon the sample surface pseudo-periodic within an incident footprint pseudo-periodic that has length and width controllable by source collimator pseudo-periodic; producing reflected electrons pseudo-periodic from the incident electrons pseudo-periodic in response to receipt of the incident electrons pseudo-periodic by the sample; collimating, by the detection collimator pseudo-periodic, the reflected electrons pseudo-periodic; producing, by the detection collimator pseudo-periodic, the collimated reflected electrons pseudo-periodic; and receiving, by the electron detector, the collimated reflected electrons pseudo-periodic from the detection collimator pseudo-periodic to perform shape metrology of the sample.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been discovered that an electron reflectometer and process for performing shape metrology provide electron reflectometry (ER) for measurement or determination of nanoscale dimensions in three dimensions at a surface with small-angle electron reflection. According to Fresnel's law, electrons have a high reflectivity from a surface at an electron energy from 5 kiloelectron volts (keV) to 100 keV at a glancing angle of less than 1° with respect to a plane of the surface. Moreover, the electron reflectometer overcomes reliance by reflective high energy electron diffraction (RHEED) on diffraction spots to determine atomistic surface structure and similar reliance by reflective small angle electron scattering (RSAES) to determine nanoscale shape morphology. Advantageously and unexpectedly, the electron reflectometer and processes measure nanoscale dimensions from intensity information of specularly reflected and non-specularly reflected electrons.

Figure 5:
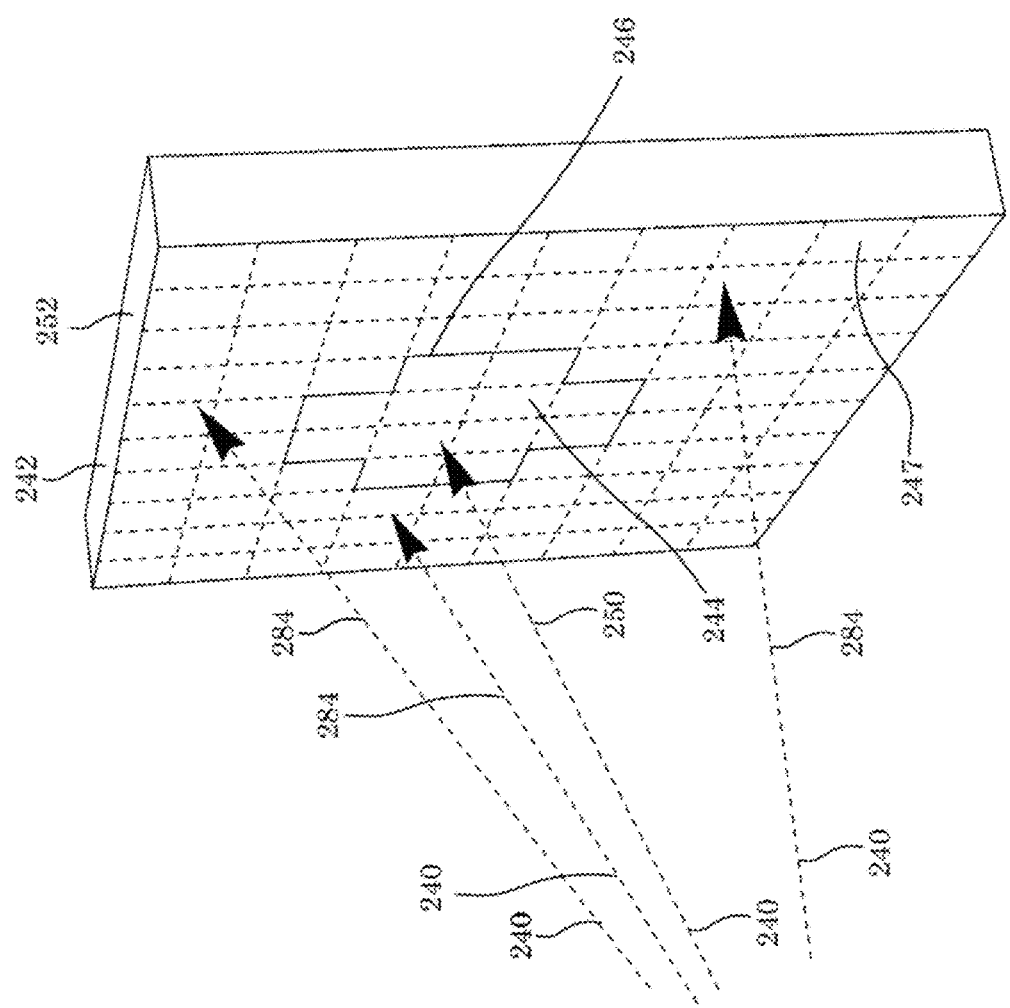
FIG. 5 shows virtual collimation and detection of reflected electrons pseudo-periodic.

In an embodiment, with reference to FIG. 1, FIG. 2 and FIG. 6 through FIG. 17, electron reflectometer 200 includes sample stage 210. Sample stage 210 receives sample 212; disposes sample 212 in a position to be analyzed; and in conjunction with source collimator 232 and detection collimator 242 provides pitch rotation 214 through pitch angle 238 to sample 212 about pitch axis 216; provides roll rotation 218 through roll angle 258 to sample 212 about roll axis 220, wherein pitch axis 216 is perpendicular to and independent of roll axis 220; and provides azimuthal rotation 222 through azimuthal angle 262 to sample 212 about azimuthal axis 224, such that sample 212 can be rotated into a measurement position. Electron reflectometer 200 also includes source 226 that produces source electrons 230 directed toward sample 212. Source collimator 232 is interposed between source 226 and sample stage 210 and receives source electrons 230; collimates source electrons 230; and produces incident electrons 234 from source electrons 230 in response to collimating source electrons 230 that travel along an incident direction 286 that is inclined at incident angle 228 with respect to sample stage 210, wherein incident angle 228 is adjustable from 0° to 5° relative to a plane through pitch axis 216 and roll axis 220. Source collimator 232 includes an electron lens 233 and source transmission aperture 236 bounded by aperture boundary wall 246 and has incident angular width 264 from 0.002° to 5°. Detection collimator receives reflected electrons 240 that are produced from incident electrons 234 reflected by sample 212, collimates reflected electrons 240 by selecting reflected electrons 240 that travel along detection direction 288, and produces collimated reflected electrons 250 from reflected electrons 240 in response to collimating reflected electrons 240. Detection collimator 242 can include detection transmission aperture 244 having detection angular width 268 from 0.002° to 5°. It is contemplated that detection angle 248 is adjustable from 0° to 5° relative to the plane through pitch axis 216 and roll axis 220. Electron reflectometer 200 also includes electron detector 252 that receives collimated reflected electrons 250, wherein electron detector 252 is disposed such that detection collimator 242 is interposed between sample stage 210 and electron detector 252 or as part of a combined detection collimator 242 and electron detector 252, e.g. as depicted in FIG. 5.

FIGS. 6 through 11 show an embodiment of electron reflectometer 200 that includes mechanically actuated sample stage 210 to perform rotations and adjust electron directions. In FIGS. 6-17, roll angle=0°, and azimuthal angle=0°. FIGS. 12 through 16 show an embodiment of electron reflectometer 200 that includes scanning coils 298 to perform rotations and adjust electron directions.

In an embodiment, electron reflectometer 200 includes energy filter 254 that receives collimated reflected electrons 250 from detection collimator 242; filters collimated reflected electrons 250 based on an energy of collimated reflected electrons 250; and communicates collimated reflected electrons 250 to electron detector 252 based on the energy of collimated reflected electrons 250.

In an embodiment, electron reflectometer 200 includes energy filter 254 that receives collimated reflected electrons 240; filters collimated reflected electrons 240 based on an energy of collimated reflected electrons 240; and communicates collimated reflected electrons 240 to detection collimator 242 based on the energy of reflected electrons 240.

In an embodiment, electron reflectometer 200 includes analyzer 260 that receives detector signal 256 from electron detector 252; analyzes detector signal 256; and determines surface morphology 270 of sample 212.

With regard to axes in several of the figures, coordinates (x, y, z) form an orthogonal coordinate system fixed to electron reflectometer 200. Electron reflectometer 200 has three rotation axes, i.e. a pitch axis, a roll axis, and an azimuthal axis. At a zero-angle setting, i.e. pitch angle=0°, roll angle=0°, and azimuthal angle=0°, the three rotation axes coincide with the coordinate axes of electron reflectometer 200, with x-axis along the roll axis, the y-axis along the pitch axis, and the z-axis along the azimuthal axis. When not in the zero-setting, the rotation axes can rotate relative to the coordinate axes of electron reflectometer 200. Coordinates (X, Y, Z) are an orthogonal coordinate system fixed to a sample.

It is contemplated that sample stage 210 can include linear x-y stage 296 to provide positioning of sample 212 to select the measured region of the sample 212; height adjustment stage 299 to align the sample 212 with the incident electrons 234; pitch goniometer 290 to provide pitch rotation 214 about the pitch axis 216; roll goniometer 292 to provide roll rotation 218 of sample 212 about the roll axis 220; rotation stage 294 to provide azimuthal rotation 222 about azimuthal axis 224; and a means of securing the sample 212. It is contemplated that sample stage 210 can be manual, can be motorized, can be comprised of one multiaxial goniometric stage and can be comprised of combined stages and goniometers mounted one upon another.

Figure 18:
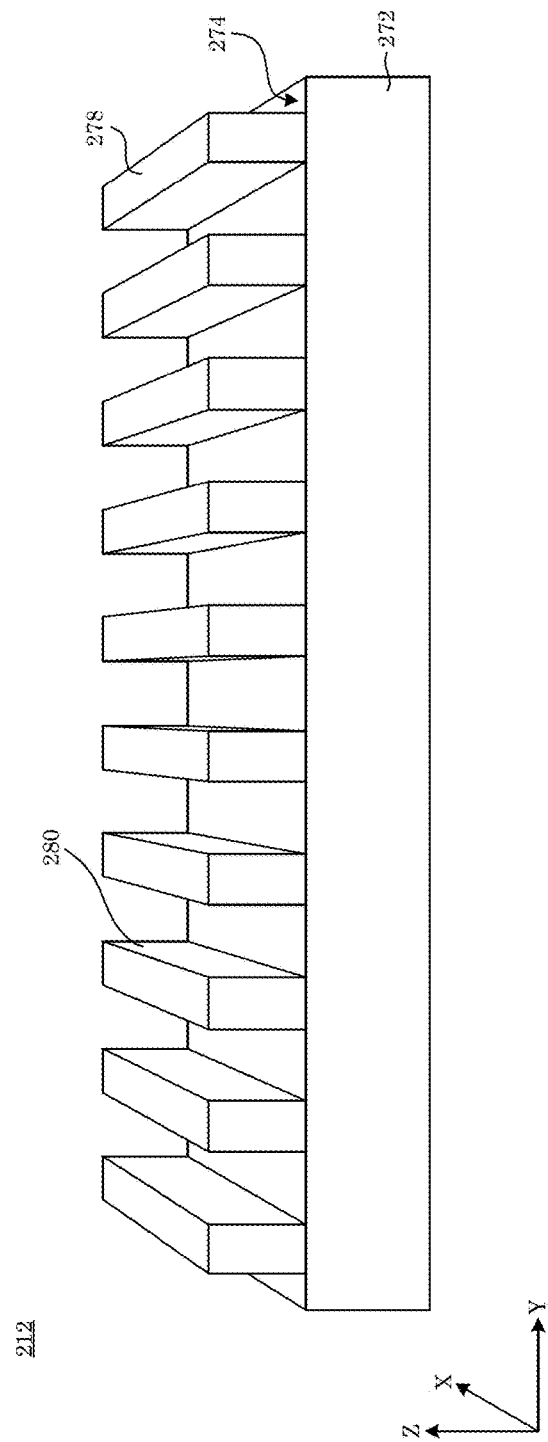
FIG. 18 shows a perspective view of a sample pseudo-periodic.
Figure 19:
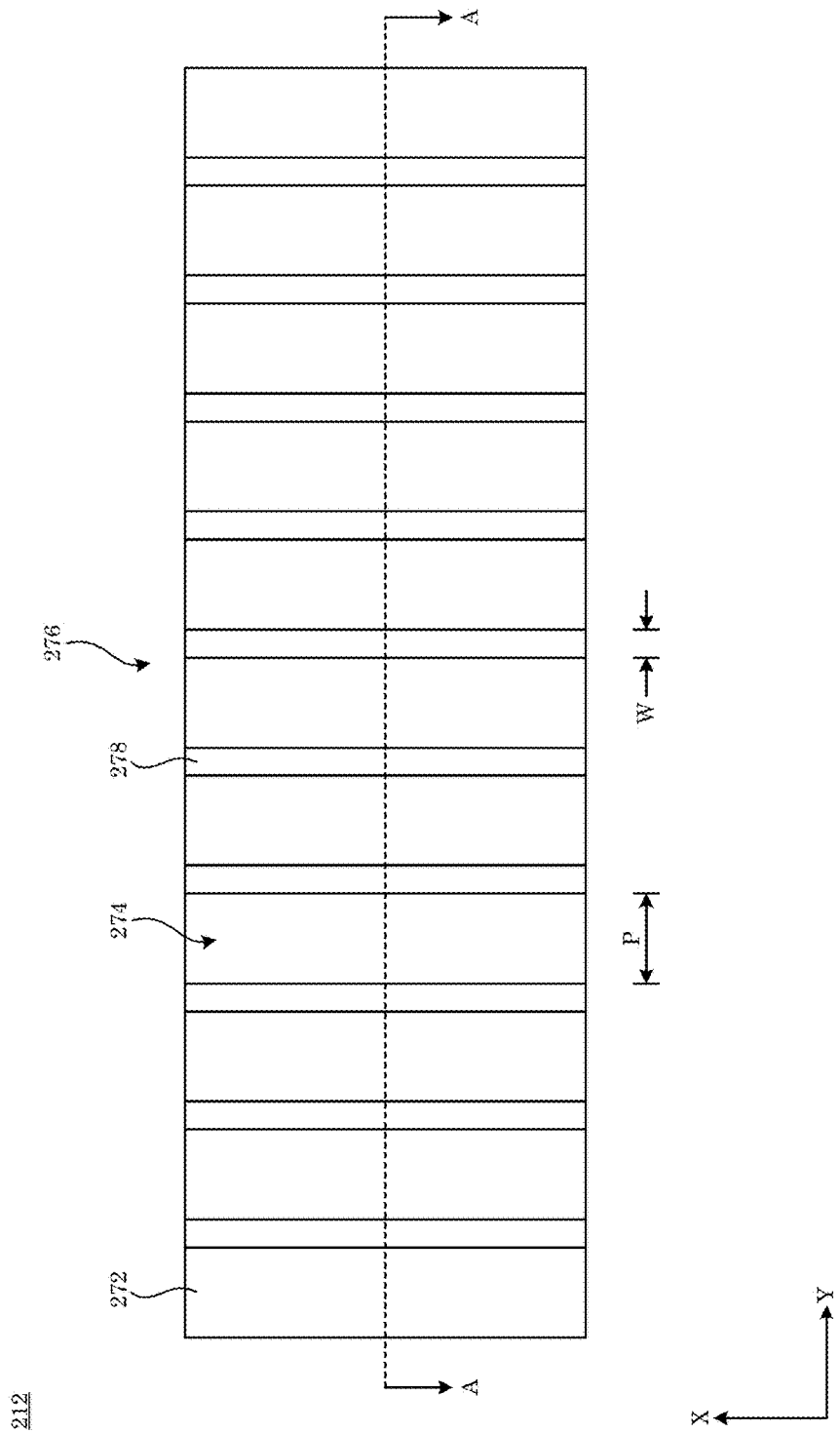
FIG. 19 shows a top view in X-Y plane of the sample shown in FIG. 18.
Figure 20:
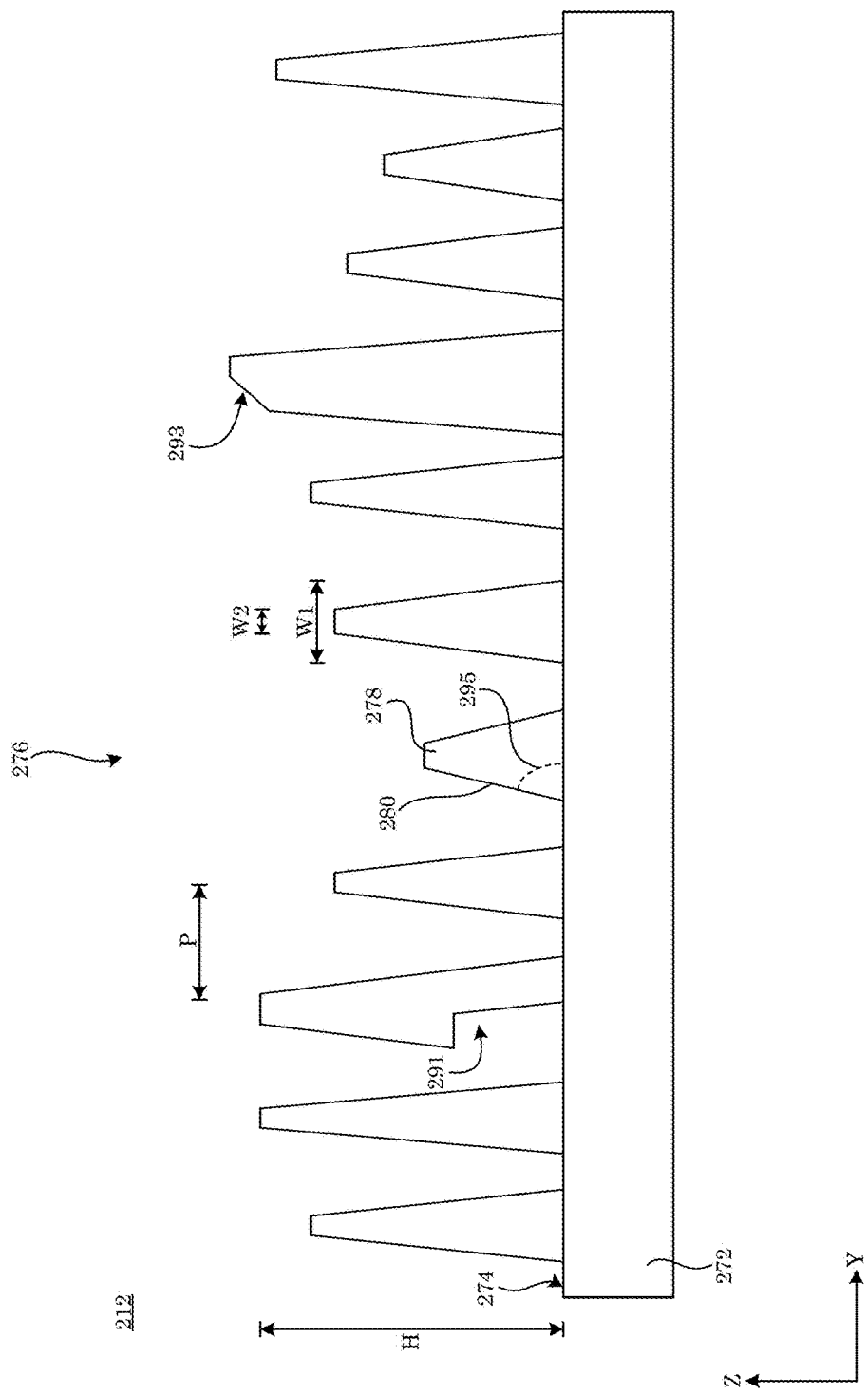
FIG. 20 shows a cross-section along line A-A of the sample shown in FIG. 19 in Y-Z plane.

In electron reflectometer 200, sample 212 can include a surface 274 that has an average orientation and normal direction and can have three-dimensional or patterned solid structure with a dimension smaller than 100 nm. Sample 212 can be an etched solid wafer such as a Si wafer or GaAs wafer, a substrate 272 with deposited material such as a thin film including metal films and photo-resist that can be etched to provide nanoscale patterning. With reference to FIG. 18, FIG. 19, and FIG. 20, sample 212 can include substrate 272 having surface 274 upon which surface member 278 are disposed. Surface member 278 and substrate 272 can be a monolithic structure or an assemblage of independent components coupled together and in communication. A plurality of surface members 278 can be arranged in pattern 276 that can include lines or a curved feature. Patterns 276 can be periodic arrays of surface members 278 separated at pitch P and can have height H, width W (e.g., W1, W2, and the like), sidewall angle 295, undercut 291, top-rounding 293, and the like. A plurality of surface members 278 can also be arranged randomly or pseudo-periodically. Substrate 272 can include Si wafers, Silicon on oxide (SOI) wafers, GaAs wafers, and sapphire wafers. Moreover, wafers can be a variety of sizes as well as diced chips. Further, surface member 278 can be of the same or different material than substrate 272 and surface 274 and can include photo-resist, oxide, metal, polymer, grown nanostructures such as nanowires, and condensed nanomaterials such as quantum dots to provide electronic, optical or chemical properties and functions. Surface members 278 can have dimensions as small as 1 nm. It is contemplated that only dimensions less than 100 nm will be measurable so that a contemplated test grating might have long lines of deposited material much longer than 100 nm, but also have width and/or height smaller than 100 nm so that only the width and height are measurable by electron reflectometry. A number of surface members 278 can be selected. Surface members 278 or patterns 276 to be measured can be chosen based on their technological or scientific interest or deliberately constructed as test patterns. It is contemplated that most accurate and precise measurements will result from patterns 276 that are periodic or pseudo-periodic. Larger areas will enhance measurement statistics and in some instances, will enhance the current of collimated reflected electrons 250. It is contemplated that measured areas determined by incident footprint 265 will have linear dimensions ranging from 10 μm to 500 μm, and that patterns 276 should be as large or larger than the measured area so that reflected electrons 240 are only produced from the pattern 276 and nowhere else. It is contemplated that the electron reflectometer 200 will be most useful for measuring the pitch P of a pattern 276 when P ranges from 2 nm to 100 nm, for measuring the height H of pattern 276 surface members 278 when H ranges from 1 nm to 100 nm and to measure the width W of pattern 276 surface members 278 when W ranges from 1 nm to 100 nm. It is contemplated that geometry of undercut 291 and similar features such as top-rounding 293 can be measured most precisely when the feature size ranges from 0.5 nm to 100 nm, specifically 0.5 nm to 10 nm, and more specifically from 0.5 nm to 5 nm. It is contemplated that the electron reflectometer 200 is extremely sensitive to sidewall angle 295 over the entire range of possible values including large overhangs.

In electron reflectometer 200, pitch rotation 214 can include rotating sample 212, roll axis 200, and azimuthal axis 224 together about pitch axis 216 by pitch angle 238 relative to incident direction 286 and detection direction 288 together. Moreover, pitch rotation 214 can include active rotation wherein sample 212, roll axis 220, and azimuthal axis 224 together undergo rotational motion about pitch axis 216; passive rotation; wherein incident direction 286 and detection direction 288 together undergo rotational motion in opposite sense about pitch axis 216; and a combination thereof to provide total pitch angle 238. Pitch rotation 214 can dispose sample 212 and instrument 200 for measurement and to adjust reflection conditions during measurement. Moreover, pitch rotation 214 can be coarsely adjustable and can be finely adjustable. Pitch rotation 214 can be provided by a fixed sample stage 210, by set screws and the like, by a pitch goniometer 290, by a combination of stages and goniometers, and by adjustment to and redisposition of source collimator 232 and detection collimator 242.

In electron reflectometer 200, pitch angle 238 can include a coarsely adjustable value, and a finely adjustable value respectively to align the elements of the electron reflectometer 200 and change incident angle 228 and detection angle 248. Coarse adjustment of pitch angle 238 can be from 0° to 90°. Fine adjustments of pitch angle 238 can be from 0° to 10°, specifically from 0° to 5° and more specifically from 0° to 2°. Fine adjustment of pitch angle 238 increments can be from 0.0001° to 0.1°, specifically 0.0001° to 0.01°, and more specifically from 0.0001° to 0.001°. Adjustment of pitch angle 238 can be performed in steps and can be performed continuously over time.

In electron reflectometer 200, pitch axis 216 can be fixed in orientation relative to the entire electron reflectometer 200, can vary in orientation with calibrations, can be movably disposed as needed to properly dispose the sample 212 and can change direction by passive roll rotation 218 and by passive azimuthal rotation 222. Moving pitch axis 216 can be performed by height adjustment stage 299 and by adjusting source collimator 232 to redirect incident electrons 234. Moreover, pitch axis 216 is perpendicular to roll axis 220, is perpendicular to azimuthal axis 224 when roll angle 258=0°, and intersects roll axis 220 and azimuthal axis 224 at sample surface 274 where incident electrons 234 are directed by source collimator 232.

In electron reflectometer 200, roll rotation 218 can include rotating sample 212 and azimuthal axis 224 together about roll axis 218 by roll angle 258 relative to pitch axis 216, incident direction 286, and detection direction 288 together. Moreover, roll rotation 218 can include active rotation wherein sample 212 and azimuthal axis 224 together undergo rotational motion about roll axis 218; passive rotation; wherein pitch axis 216, incident direction 286, and detection direction 288 together undergo rotational motion in opposite sense about roll axis 218; and a combination thereof to provide total roll angle 258. Moreover, roll rotation 218 can be fixed, can be coarsely adjustable and can be finely adjustable. Roll rotation 218 can be provided by sample stage 210 via a fixed stage, set screws and the like, by a roll goniometer 292, by a combination of stages and goniometers, and can be provided by adjustment and by redisposition of source collimator 232 and detection collimator 242.

In electron reflectometer 200, pitch angle 258 can include a fixed value, a coarsely adjustable value, and a finely adjustable value to align the elements of the electron reflectometer 200 and to facilitate measurements that require non-zero roll. Coarsely adjusted roll angle 258 can be from −90° to 90°, specifically from −60° to 60°, and more specifically from −30° to 30°. Fine adjustments of roll angle 258 can be from −10° to 10°, specifically from −5° to 5° and more specifically from −2° to 2°. Fine adjustment increments in roll angle 258 can be from 0.0001° to 0.1°, specifically 0.0001° to 0.01°, and more specifically from 0.0001° to 0.001°. Adjustments in roll angle 258 can be performed in steps and can be performed continuously over time. Roll angle 258 is equal to angle between pitch axis 216 and azimuthal axis 224 subtracted from 90°.

In electron reflectometer 200, roll axis 220 can be fixed in orientation relative to the entire electron reflectometer 200, can vary in orientation with calibrations, can be movably disposed to dispose sample 212 for measurement, and can rotate as a result of active pitch rotation 214 and passive azimuthal rotation 222. Moving roll axis 220 can be performed by adjusting source collimator 232 to redirect incident electrons 234. Moreover, roll axis 220 is perpendicular to both pitch axis 216 and azimuthal axis 224, is ideally tangent to the sample surface 274, and intersects pitch axis 216 and azimuthal axis 224 at sample surface 274 where incident electrons 234 are directed by source collimator 232.

In electron reflectometer 200, azimuthal rotation 222 can include rotating sample 212 about azimuthal axis 224 by azimuthal angle 262 relative to pitch axis 216, roll axis 220, incident direction 286, and detection direction 288 together. Moreover, azimuthal rotation 222 can include active rotation; wherein sample 212 undergoes rotational motion about azimuthal axis 224; passive rotation; wherein pitch axis 216, roll axis 200, incident direction 286, and detection direction 288 together undergo rotational motion in opposite sense about azimuthal axis 224; and a combination thereof to provide total azimuthal angle 262. Moreover, azimuthal rotation 222 can be fixed, can be coarsely adjustable and can be finely adjustable. Azimuthal rotation 222 can be provided by sample stage 210 via a fixed stage, set screws and the like, by a rotation stage 294, by a combination of stages and goniometers, and can be provided by adjustment of source collimator 232 and detection collimator 242.

In electron reflectometer 200, azimuthal axis 224 can be fixed in orientation relative to the entire electron reflectometer 200, can vary in orientation with calibrations, can be movably disposed as needed to properly dispose the sample 212 and can rotate as a result of passive pitch rotation 214 and passive roll rotation 218. Moving azimuthal axis 224 can be performed by adjusting source collimator 232 to redirect incident electrons 234. Moreover, azimuthal axis 224 is perpendicular to roll axis 220, is perpendicular to pitch axis 216 when roll angle 258=0°, intersects pitch axis 216 and roll axis 220 at sample surface 274 where incident electrons 234 are directed by source collimator 232, and is ideally perpendicular to sample surface 274.

In electron reflectometer 200, pitch angle 262 can include a fixed value, a coarsely adjustable value, and a finely adjustable value to align the elements of the electron reflectometer 200 and to facilitate ER measurements that require azimuthal rotation 222. Coarse adjustment of azimuthal angle 262 can be from −180° to 180°, specifically from −90° to 90°, more specifically from −45° to 45°. Fine adjustment of azimuthal angle 262 can be from −10° to 10°, specifically from −5° to 5° and more specifically from −2° to 2°. Fine adjustment increments can be from 0.0001° to 0.1°, specifically 0.0001° to 0.01°, and more specifically from 0.0001° to 0.001°. Adjustments can be performed in steps and can be performed continuously over time.

In electron reflectometer 200, source 226 can include a variety of electron source types used in other applications including: a tungsten thermionic source, a $LaB_6$ thermionic source, a Schottky emission source and a cold field emission gun (FEG) to provide source electrons 230 directed toward source collimator 232. The source 226 can include a monochromator and an electron lens 233. The source 226 can provide source electrons 230 with kinetic energy ranging from 100 eV to 100 keV, specifically from 1 keV to 80 keV, and more specifically from 5 keV to 30 keV. The source 226 can have a brightness such that when combined with other elements of the electron reflectometer 200, there will be sufficient current of collimated reflected electrons 250 to measure. Brightness of electrons can be roughly from $10^6$ A $m^{-2}$ $rad^{-2}$ to $10^{14}$ A $m^{-2}$ $rad^{-2}$ depending on choice of electron source 226 and source settings. Moreover, source 226 can be fixed, calibrated and movable disposed as required by source collimator 232 to provide incident electrons 234 directed along incident direction 286.

In electron reflectometer 200, source electrons 230 can have a variety of kinetic energies and brightnesses chosen to provide currents of collimated reflected electrons 250 and detector signal 256. Brightness of electrons can be roughly from $10^6$ A $m^{-2}$ $rad^{-2}$ to $10^{14}$ A $m^{-2}$ $rad^{-2}$ depending on choice of electron source 226 and source settings. An energy of source electrons 230 can be 100 eV to 100 keV, specifically from 1 keV to 80 keV, and more specifically from 5 keV to 30 keV.

Figure 1:
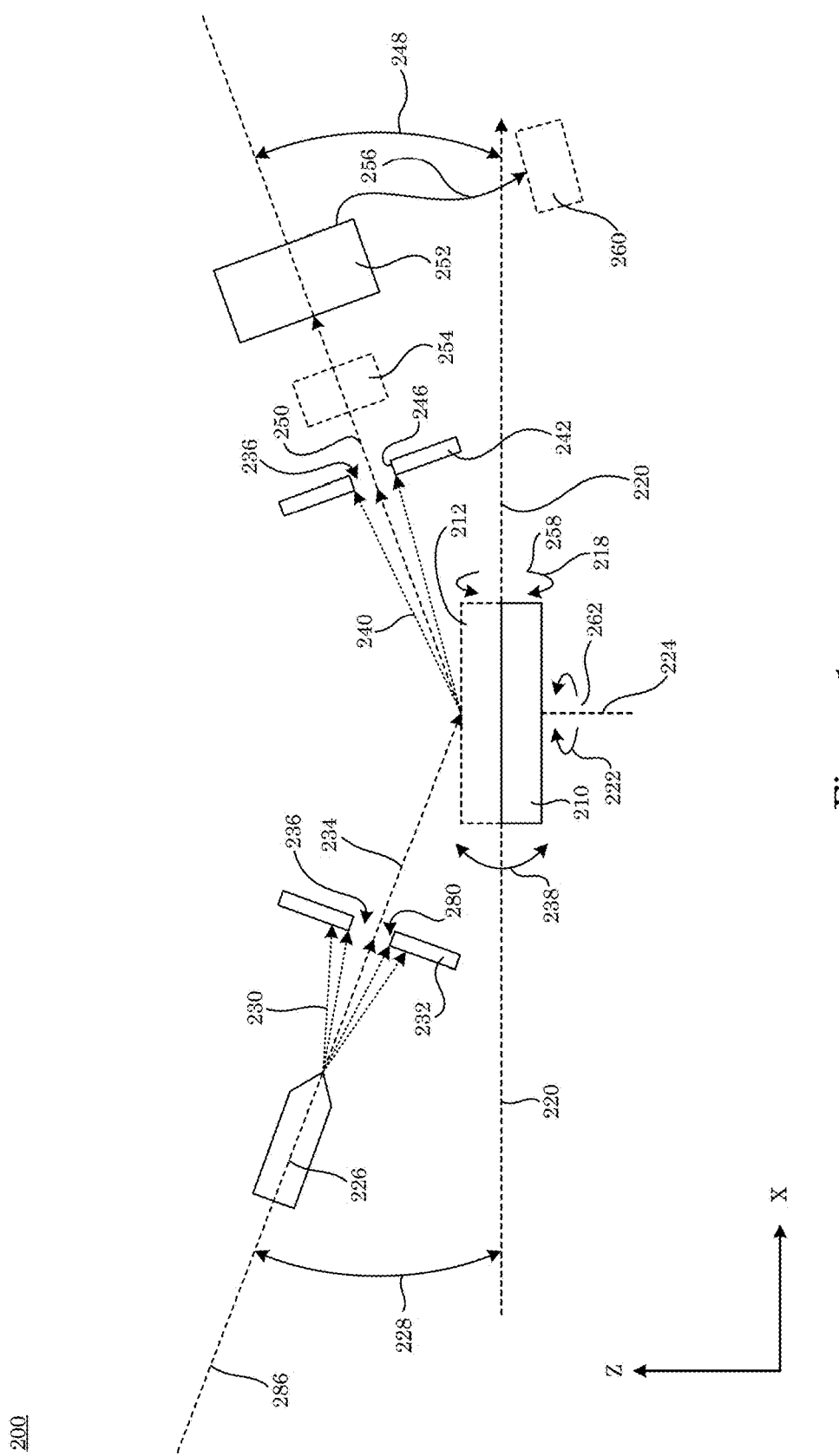
FIG. 1 shows a side view in a x-z plane of electron reflectometer.
Figure 2:
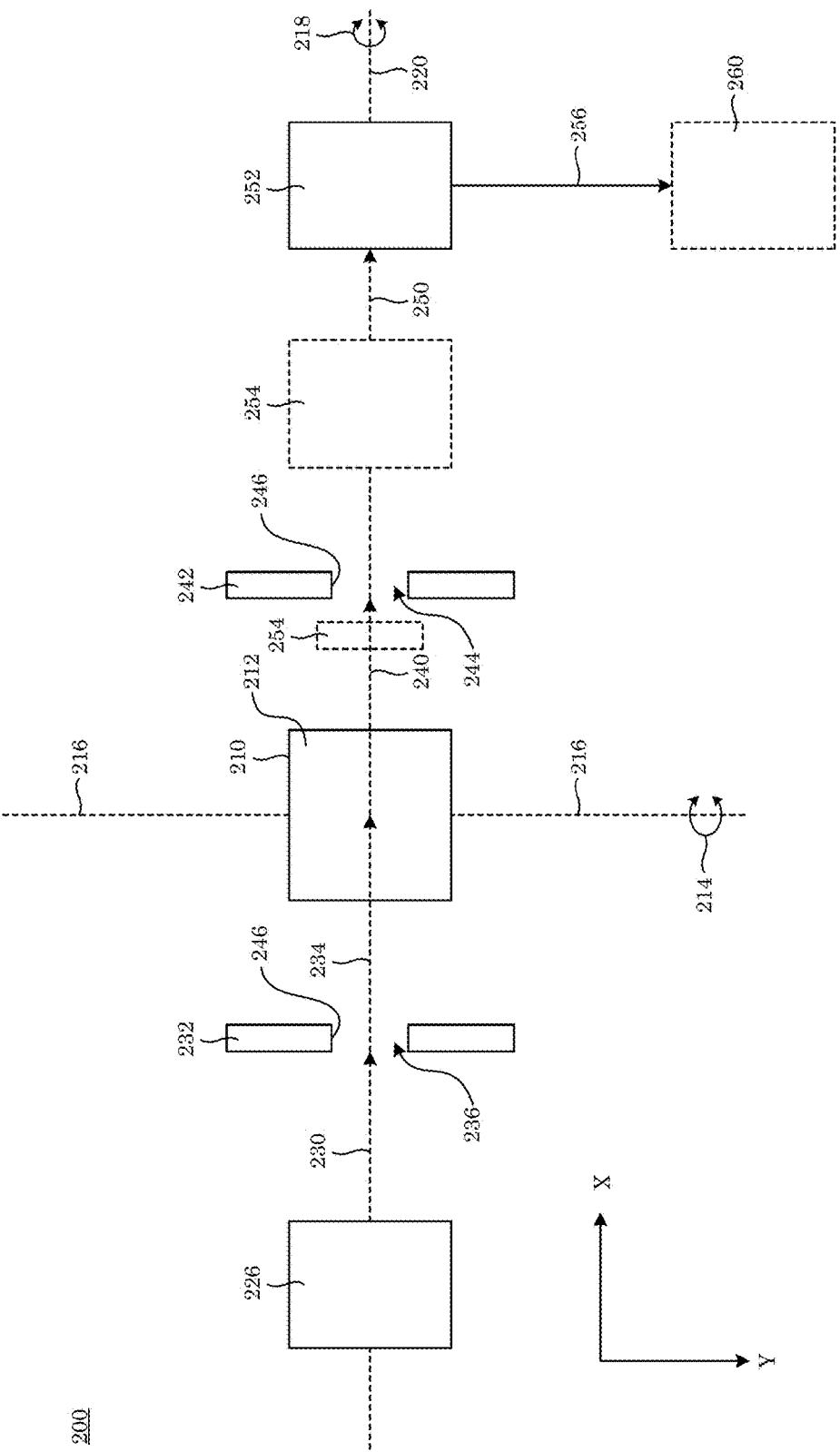
FIG. 2 shows a top view in an x-y plane of the electron reflectometer shown in FIG. 1.
Figure 3:
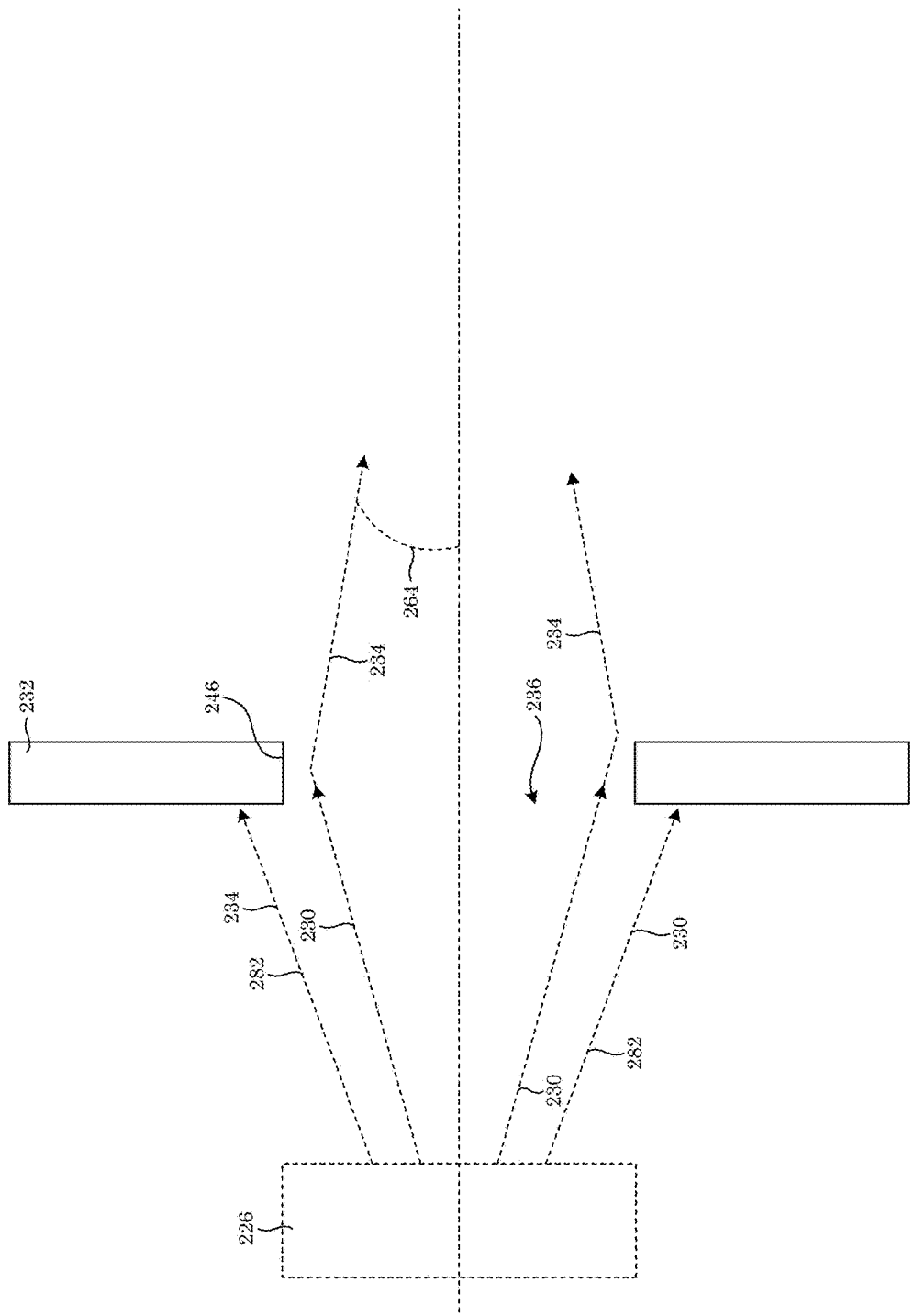
FIG. 3 shows collimation of source electrons pseudo-periodic.

In electron reflectometer 200, source collimator 232 can include an electron lens 233, a scanning coil 298, an electron stigmator and a source transmission aperture 236 to provide incident electrons 234 that travel toward sample 212 along incident direction 286 with incident angle 228 and incident angular width 264 to impinge upon sample surface producing an incident footprint 265. With reference to FIG. 3, source collimator 232 can refocus source electrons 230, e.g.

by means of electrons lens 233, to provide convergent beam as needed to provide incident angular width 264 and incident footprint 265. With reference to FIG. 3, source collimator 232 includes source transmission aperture 236 bounded by aperture boundary wall 246, wherein source collimator 232 transmits some electrons through source transmission aperture 236 to provide electrons that propagate within incident angular width 264 of incident direction 286 and stops other electrons that would otherwise propagate beyond incident angular width 264, e.g. by blocking. Source electrons 230 that pass through source transmission aperture 236 of source collimator 232 are incident electrons 234. Source electrons 230 that are blocked by source collimator 232 can be referred to as blocked or discarded electrons 282.

In electron reflectometer 200, incident angle 228 is the angle between incident direction 286 and the plane through pitch axis 216 and roll axis 220. Incident angle 228 can be varied by adjusting source collimator 232 and can be varied by changing pitch rotation 214. Incident angle 228 can be from 0° to 5°, specifically from 0° to 2°, and more specifically from 0° to 1°.

In electron reflectometer 200, incident angular width 264 is the convergence angle or divergence angle of incident electrons 234 and can include a single value specifying the angular width of beam of incident electrons 234 with a circular cross-section, and can include two or three values to specify individually the angular width of an a beam of incident electrons 234 that has elliptical cross-section, rectangular cross-section and the like. Incident angular width 264 limits the angular variation of directions of travel of incident electrons 234 from incident direction 286. Incident angular width 264 can be fixed or variable. It is contemplated that incident angular width 264 can be changed by selecting a source transmission aperture 236 and by adjusting an electron lens 233. Incident angular width 264 can greatly affect angular resolution of ER measurements, incident footprint 265, and current of incident electrons 234 and consequently currents of reflected electrons 240 and collimated reflected electrons 250. Small value of incident angular width 264 can improve angular resolution electron reflectometer, reduce the size of incident electron footprint 265, and simplify data analysis; however, reducing incident angular width 264 also reduces current of incident electrons 234 in accordance with the law of conservation of brightness, and for some sizes of incident footprint 265 may be limited by electron diffraction. Choice of incident angular width 264 can be made in consideration of other elements of electron reflectometer 200 including: incident electron footprint 265, detection angular width 268, electron detector 252 and analyzer 260. Values of incident angular width 264 can be from 0° to 5°, specifically from 0° to 0.5°, and more specifically from 0° to 0.01°.

In electron reflectometer 200, incident electrons 234 can have a variety of kinetic energies and brightnesses to provide angular resolution and currents for measurement process. Moreover, incident electrons 234 can be directed toward different areas of sample 212 by movably disposing sample 212 and by redirecting incident electrons 234 with source collimator 232. Brightness of electrons can be roughly from $10^6$ A m$^{-2}$ rad$^{-2}$ to $10^{14}$ A m$^{-2}$ rad$^{-2}$ depending on choice of electron source 226 and source settings. Energy of source electrons 234 can be 100 eV to 100 keV, specifically from 1 keV to 80 keV, and more specifically from 5 keV to 30 keV. Incident electrons 234 impinge on sample 212 at incident angle 228 with incident angular width 264 to produce an incident footprint 265 on sample surface 274.

In electron reflectometer 200, source transmission aperture 236 selects from source electrons 230 those electrons that will be transmitted as incident electrons 234. source transmission aperture 236 can be a transparent region to source electrons 230 in a component that is otherwise opaque to source electrons 230 to exclude source electrons 230 with trajectories that would deviate from incident direction 286 by more than incident angular width 264. Source transmission aperture 236 can be a hole, a notch, and a slit in a metal strip. Examples of usable metal strips include Pt/Ir strips, Mo strips and Au strips. Source transmission aperture 236 can include a space between a plurality of opaque components. Source transmission aperture 236 can be a region that is rendered transparent to source electrons 230 by thinning and the like.

In electron reflectometer 200, incident footprint 265 is region of sample surface 274 illuminated by incident electrons 234. It's size and shape can be provided by selecting and adjusting electron source 226, adjusting distance between source 226 and source collimator 232, adjusting focal length of electron lens 233 in collimator, and by adjusting focal lengths of multiple electron lenses 233. Moreover, incident footprint 265 can determine which region of sample surface 274 is measured, and can be moved and reshaped by adjusting and by movably disposing source collimator 232, source transmission aperture 236, scanning coil 298, incident angular width 264, incident angle 228 and by movably disposing sample 212 with motion of sample stage 210, by linear x-y stage 296, linear stage 297 and the like.

In electron reflectometer 200, reflected electrons 240 can include incident electrons 234 that are reflected elastically and inelastically from sample 212, including electrons that are specularly reflected, diffracted, and diffusely reflected, and they can be contaminated with secondary electrons that are scattered out of sample 212. Moreover, elastically reflected electrons will have identical energies to incident electrons 234, while inelastically reflected electrons can have energies that differ from energies of incident electrons 234. Reflected electrons 240 are received by detection collimator 242 to produce collimated reflected electrons 250.

In electron reflectometer 200, detection collimator 242 can include electron optical components: scanning coil 298 and electron lens 233, a detection transmission aperture 244 to select from reflected electrons 250 those electrons with direction of travel that are sufficiently close to the detection direction 288 as determined by the detection angular width 268 and that originate from incident footprint 265 on sample 212. Moreover, detection collimator can be part of electron detector 252. For example, with regard to FIG. 5 a pixelated area detector as shown or perhaps a phosphor with pixelated camera can function as both electron detector 252 and detection collimator 242 by selecting which pixels will contribute to measured reflection intensity.

In electron reflectometer 200, detection transmission aperture 244 can include a region that is transparent or sensitive to reflected electrons 240 in a component that is otherwise opaque or insensitive to reflected electrons 240 to exclude reflected electrons 240 that have trajectories that deviate from detection direction 288 by more than detection angular width 268. Detection transmission aperture 244 can be a hole, a notch, and a slit in a metallic strip. Examples of metallic strips include Pt/Ir, Mo, and Au strips. With Reference to FIG. 6 through FIG. 11, detection transmission aperture 244 can include a space between opaque components. Detection transmission aperture 244 can be abstract as in pixels in an area detector as in FIG. 5 that are selected for post processing and can be the sensitive area of a detector such as a geometrically limited phosphor.

In electron reflectometer 200, detection angle 248 is angle between detection direction 288 selected by detection collimator 242 and the plane through pitch axis 216 and roll axis 220. Detection angle 248 can be varied by settings and redisposition of detection collimator 242 and by changing pitch rotation 214. Incident angle 228 can be from 0° to 5°, specifically from 0° to 2°, and more specifically from 0° to 1°.

In electron reflectometer 200, detection angular width 268 is the convergence angle or divergence angle of reflected electrons 234 to be selected for collimation by detection collimator 242; and can include a single value specifying the angular width of beam of collimated reflected electrons 250 with a circular cross-section, and can include two or three values to specify individually the angular width of a beam of collimated reflected electrons 250 with elliptical cross-section and the like. Detection angular width 268 limits the selection of reflected electrons 240 to be transmitted as collimated reflected electrons 250 by their angular variation of directions of travel from detection direction 288. Detection angular width 268 can be fixed or variable. It is contemplated that detection angular width 268 can be changed by selecting a detection transmission aperture 244 for a given measurement or by activating and deactivating pixels in an area detector as shown in FIG. 5. Detection angular width 268 can greatly affect angular resolution of ER measurements and current of collimated reflected electrons 250. Small value of detection angular width 268 can improve angular resolution of electron reflectometer and simplify data analysis; however, reducing detection angular width 268 also reduces current of collimated reflected electrons 250 in accordance with the law of conservation of brightness. Choice of detection angular width 268 can be made in consideration of other elements of electron reflectometer 200 including: incident angular width 264, incident electron footprint 265, electron detector 252 and analyzer 260. Values of 268 can be from 0° to 5°, specifically from 0° to 0.05°, and more specifically from 0° to 0.01°.

Figure 4:
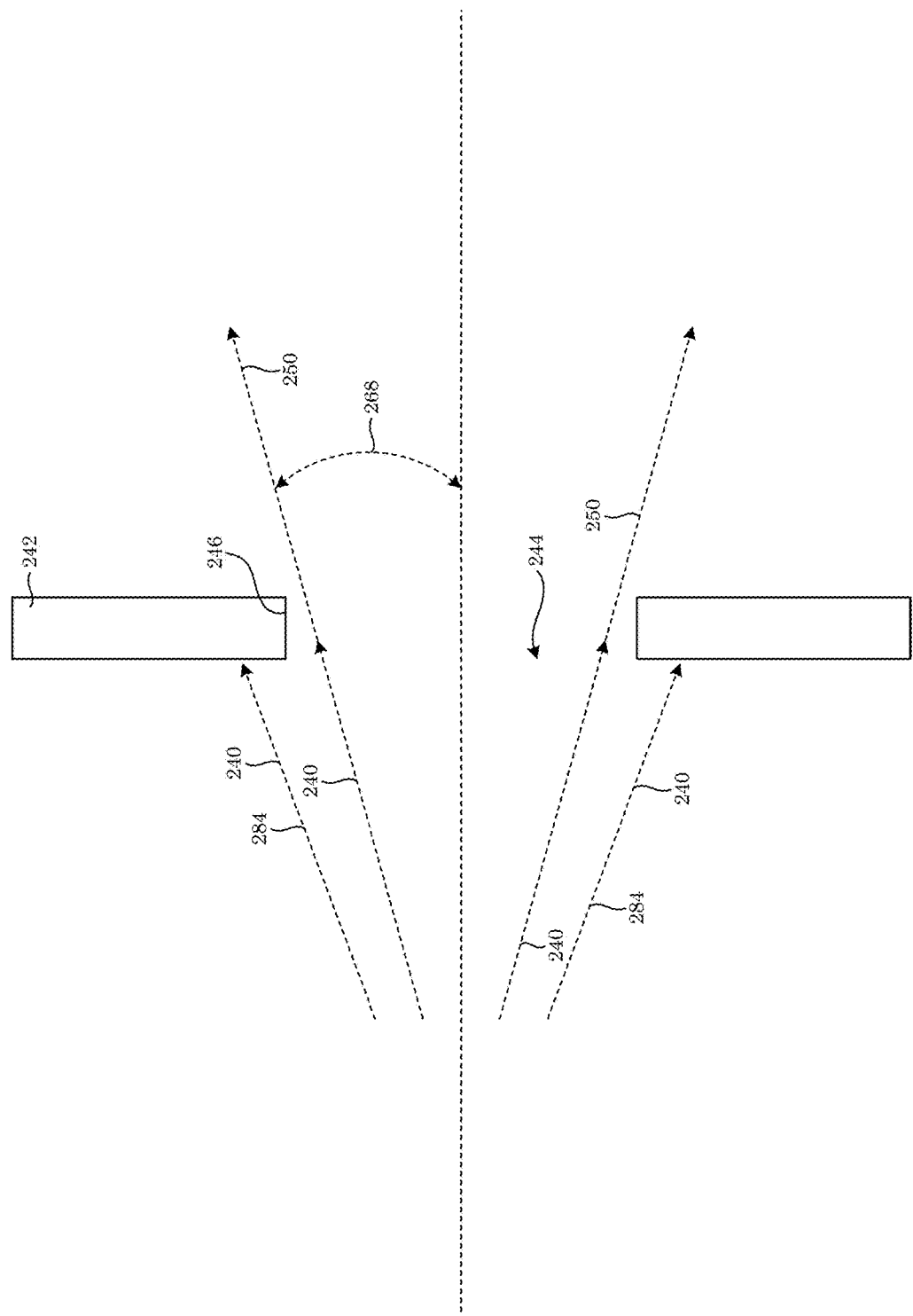
FIG. 4 shows collimation of reflected electrons pseudo-periodic.

In electron reflectometer 200, collimated reflected electrons 250 are produced by detection collimator 242 from reflected electrons 240 to be selectively detected by electron detector 252. Collimated reflected electrons 250 can maintain travel directions of selected reflected electrons 240, and can have altered directions of travel as part of the collimation process or as a byproduct of collimation. It is contemplated that reflected electrons 240 and collimated reflected electrons 250 independently include elastically scatted electrons, inelastically scatted electrons, specularly reflected electrons, non-specularly reflected electrons, secondary electrons, or a combination of the foregoing types of reflected electrons. With reference to FIG. 4, detection collimator 242 includes detection 244 bounded by aperture boundary wall 246, wherein detection transmission aperture 244 transmits reflected electrons 240 that propagate within detection angular width 268 and does not transmit reflected electrons 240 that propagate beyond detection angular width 268, e.g., by blocking. Reflected electrons 240 that are not transmitted by detection collimator 242 can be referred to as blocked or discarded electrons 284. Collimated reflected electrons 250 are reflected electrons 240 that are transmitted through detection transmission aperture 244 of detection collimator 242. With reference to FIG. 5, reflected electrons 240 can be collimated by a combined detection collimator 242 and electron detector 252 to produce collimated reflected electrons 250 by a virtual process. In FIG. 5, a pixelated detector is shown that serves as both detection collimator 242 and electron detector 252. Detection transmission aperture 244 is comprised of all pixels 247 that are activated or counted. Boundary between counted or activated pixels 247 and uncounted or deactivated pixels 247 form a virtual aperture boundary wall 246.

In electron reflectometer 200, electron detector 252 can measure current of collimated reflected electrons 250, can measure kinetic energy current of collimated reflected electrons 250, and can include a phosphor screen, a camera, a scintillator, a photomultiplier, a solid state diode detector, a Faraday cup, an electrode and an electrometer. Moreover, electron detector 252 is sensitive to anticipated currents of collimated reflected electrons 250 that are anticipated to be a fraction of current of incident electrons 234; wherein the ratio of current of collimated reflected electrons 250 to current of incident electrons 234 can be from $10^{-10}$ to 1, specifically $10^{-6}$ to 1, more specifically from $10^{-3}$ to 1.

In electron reflectometer 200, energy filter 254 selects electrons for detection according to their kinetic to discriminate between electrons reflected elastically, electrons reflected inelastically, between electrons reflected by the various modes inelastic scattering and from secondary electrons. Energy filter 254 can include a retarding mesh, a magnetic prism, a slit-filter located at a dispersion plane in combination with other electron optics, and the like. Energy filter can be interposed between sample stage 210 and detection collimator 242 to filter reflected electrons 240, and can be interposed between detection collimator 242 and electron detector 252 to filter collimated reflected electrons 252.

In electron reflectometer 200, analyzer 260 can include a dedicated computer or instrument that can compare and contrast detector signal 256 to an expected signal shape, compare and contrast detector signal 256 to a variety of hypothesized signal shapes, perform statistical regression of detector signal 256 to a physical model to determine physical geometry of sample 212 and surface morphology 270, employ machine learning algorithms to determine physical geometry of sample 212 and surface morphology 270. Analyzer 260 can include analog to digital converter, computer components, can communicate with electronic hardware controlling electron reflectometer 200, and can be directly integrated with electronic hardware controlling electron reflectometer 200.

In electron reflectometer 200, surface morphology 270 can be a qualitative or quantitative description of sample surface 274, surface members 278 and groups and patterns 276 of surface members 278: including measurement of pitch P, height H, width W, sidewall angle 295, the presence, absence and size of small features including undercut 291 and top-rounding 293, statistical characterization such as densities of random arrays, disorder including aperiodicity, pseudo-periodicity, pitch-walking, overall size-distributions of nanoparticles and any geometric property that can be quantified using stationary statistics such as densities, means, standard deviations, correlations and the like.

In an embodiment, a process for making electron reflectometer 200 with respect to FIG. 6 through FIG. 11 includes: providing a main body for environment and structural support of electron reflectometer 200; disposing source 226 on one side of main body of electron reflectometer 200; disposing source collimator 232 adjacent to source 226; constructing sample stage 210; disposing sample stage 210 interposed between source collimator 232 and anticipated detection collimator 242; constructing detection collimator 242; disposing detection collimator 242 interposed between anticipated location of sample 212 on sample stage 210 and electron detector 252; disposing electron detector to receive and detect collimated reflected electrons 250.

Providing main body of electron reflectometer 200 includes constructing or customizing a vacuum chamber to provide mean-free-path of electrons large enough so that electron scattering away from sample does not render measurement impossible. An electron mean-free-path comparable to or larger than the distance from source 226 to detector 252 should be sufficient. Main body includes ports to allow power and signal wires to reach the same, and to allow insertion and removal of sample 212 and mounting of sample 212 upon sample stage 210 and includes ports and attachment points for other elements of electron reflectometer.

Disposing source 226 on main body of electron reflectometer 200 includes providing fixed or movable attachments and ensuring that source collimator 232 can receive source electrons 230. In embodiment depicted in FIG. 6 through FIG. 11, source 226 provides source electrons 230 mostly directed along incident direction 286.

Disposing source collimator 232 adjacent to source 226 includes disposing electron lenses 233 and source transmission aperture 236 so that they are aligned with electron source 226 and anticipated location of sample 212 to receive source electrons 230 and provide incident electrons 234 along incident direction 286. In embodiment depicted in FIG. 6-FIG. 11, components of source collimator 232 are all aligned to transmit electrons along incident direction 286.

Constructing sample stage 210 includes: assembling together pitch goniometer 290 to provide pitch rotation 214, roll goniometer 292 to provide roll rotation 218, optional height adjustment stage 298 for repositioning of sample 212; optional linear x-y stage 296 for repositioning of sample 212 in plane perpendicular to azimuthal axis 224; and rotation stage 294 to provide azimuthal rotation 222. Constructing sample stage 210 can anticipate size and shape of a sample 212 to leave space and range of motion to allow roll axis 220 to be aligned tangent to sample surface 274 and azimuthal axis 224 to be aligned perpendicularly to sample surface 274. It is contemplated that aligning pitch goniometer 290, roll goniometer 292, and rotation stage 294 so that their respective centers of rotation have a common point of intersection will help provide most precise and accurate pitch rotation 214, roll rotation 216, and azimuthal rotation 222.

Disposing sample stage 210 interposed between source collimator 232 and anticipated detection collimator 242 includes placement and alignment of sample stage 210 so that anticipated mounted sample 212 can receive from source collimator 232 incident electrons 234 traveling along incident direction 286 at point of common intersection of pitch axis 216, roll axis 220 and azimuthal axis 224. If sample stage 210 includes optional linear x-y stage 296 and height adjustment stage 299, sample stage 210 can be disposed so that range of motion of an anticipated sample surface 274 can move through this point of common intersection.

Figure 6:
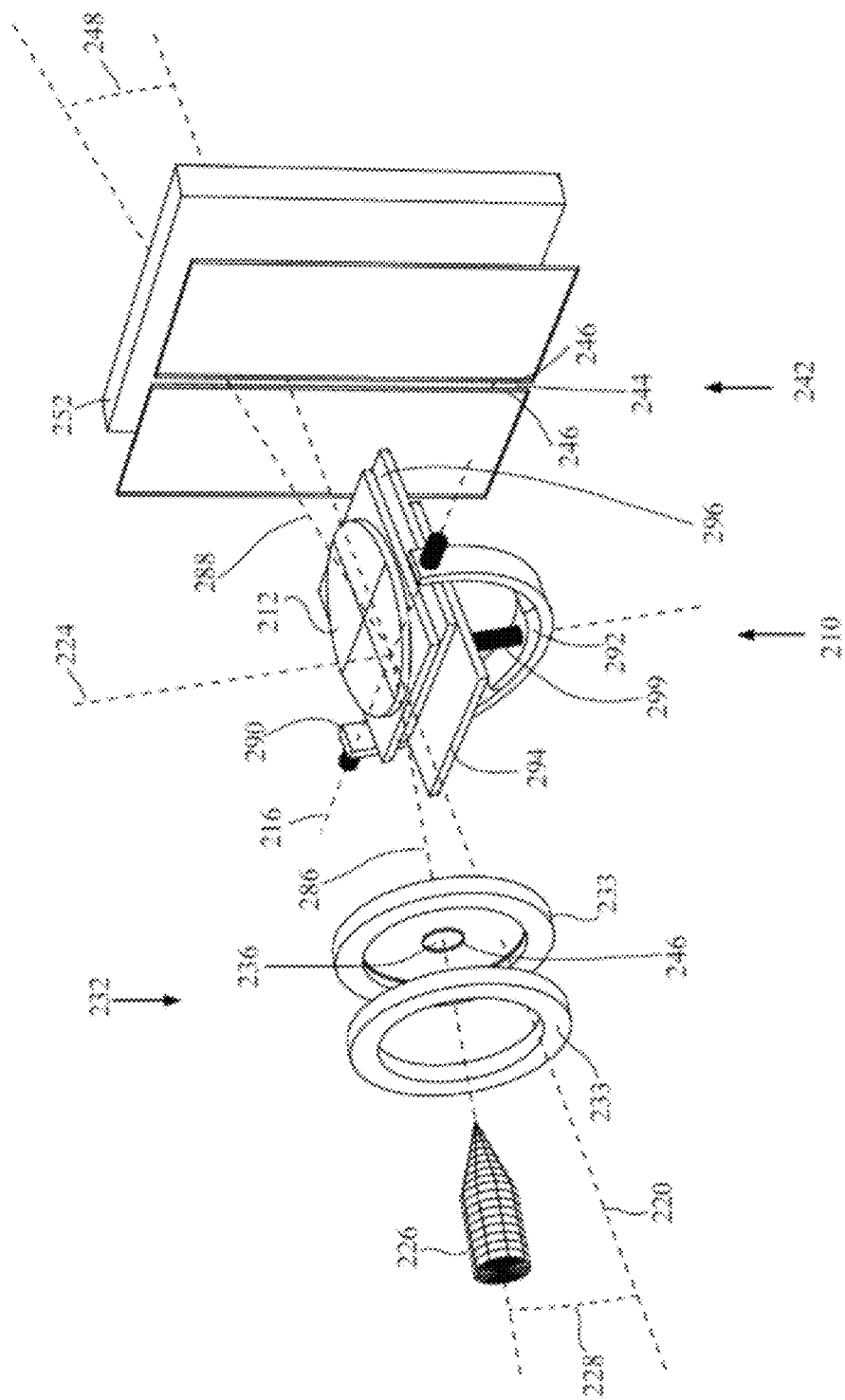
FIG. 6 shows oblique view of embodiment of electron reflectometer pseudo-periodic with rotation axes and electron directions shown.
Figure 7:
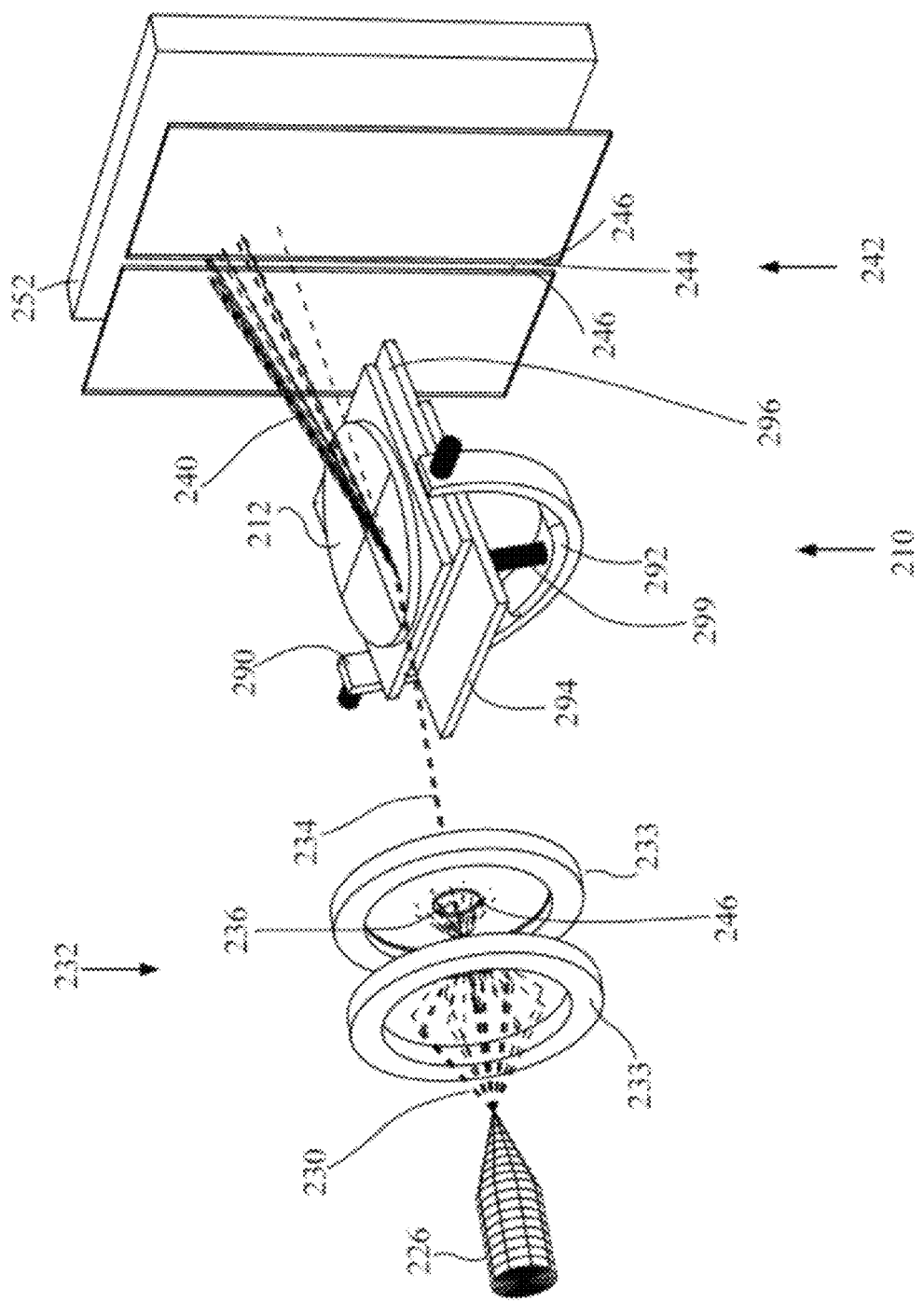
FIG. 7 shows oblique view of embodiment of electron reflectometer pseudo-periodic with electrons shown.
Figure 8:
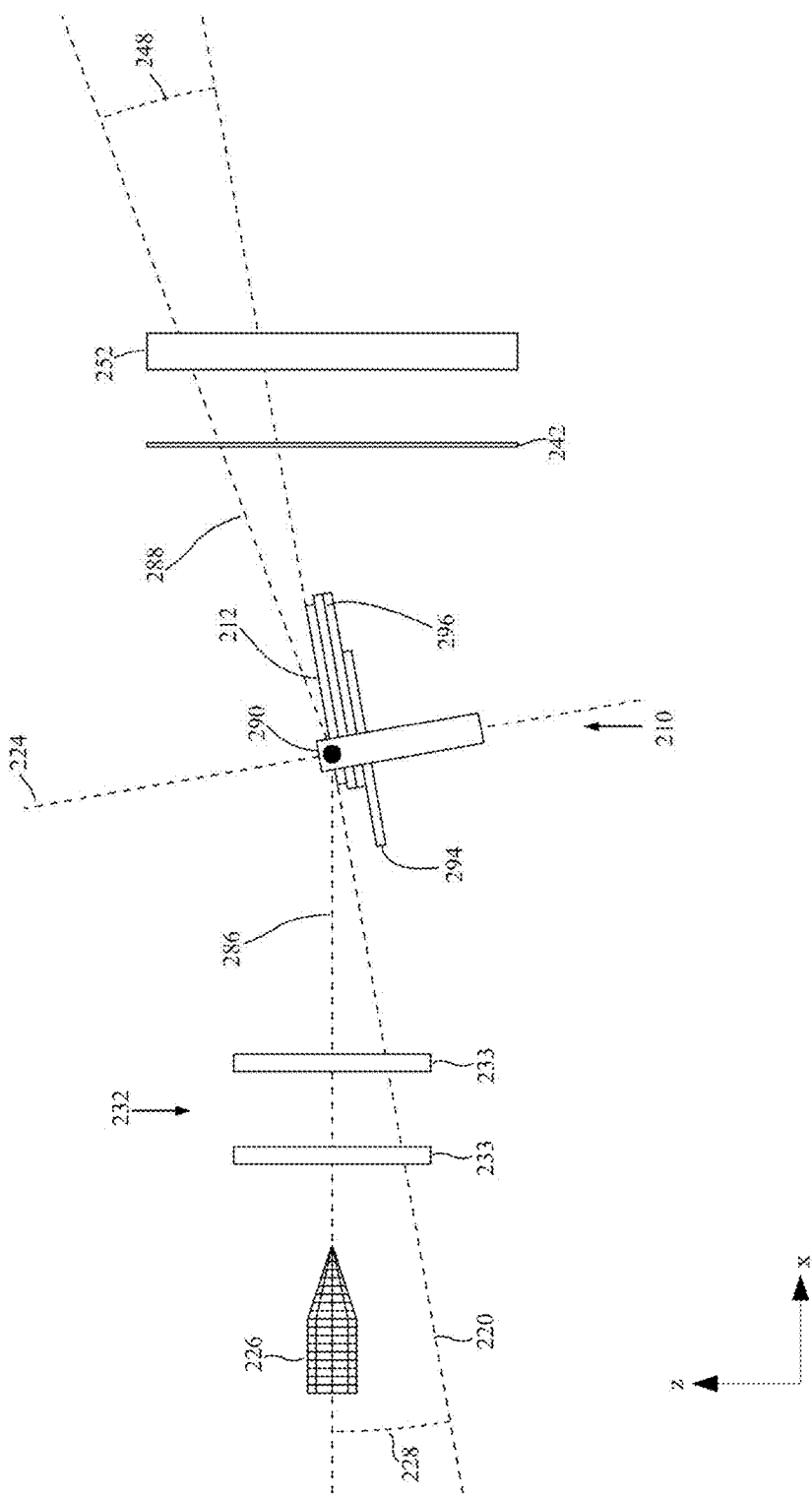
FIG. 8 shows side view in x-z plane of embodiment of electron reflectometer pseudo-periodic with rotation axes and electron directions shown.
Figure 9:
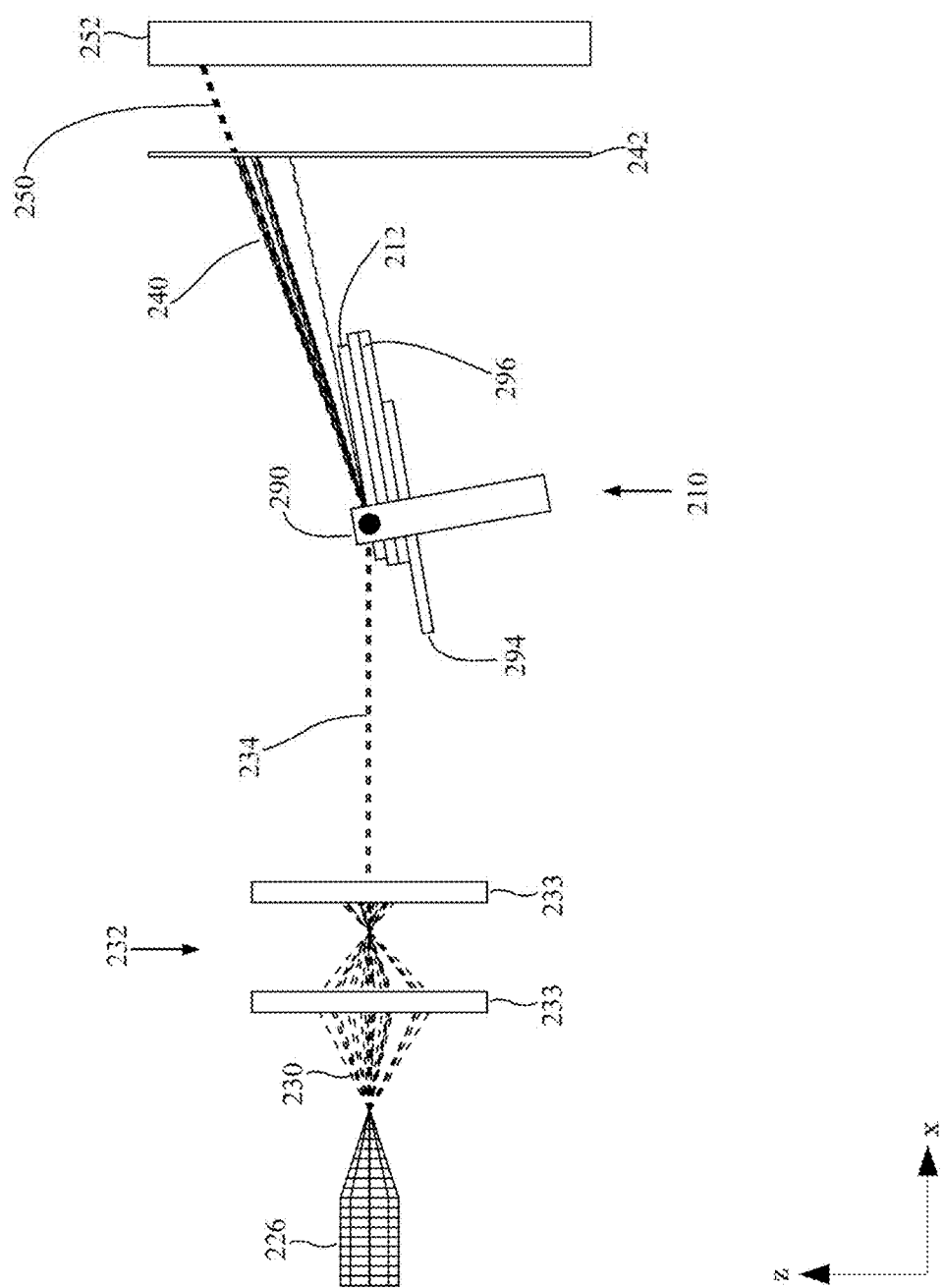
FIG. 9 shows side view in x-z plane embodiment of electron reflectometer pseudo-periodic with electrons shown.
Figure 10:
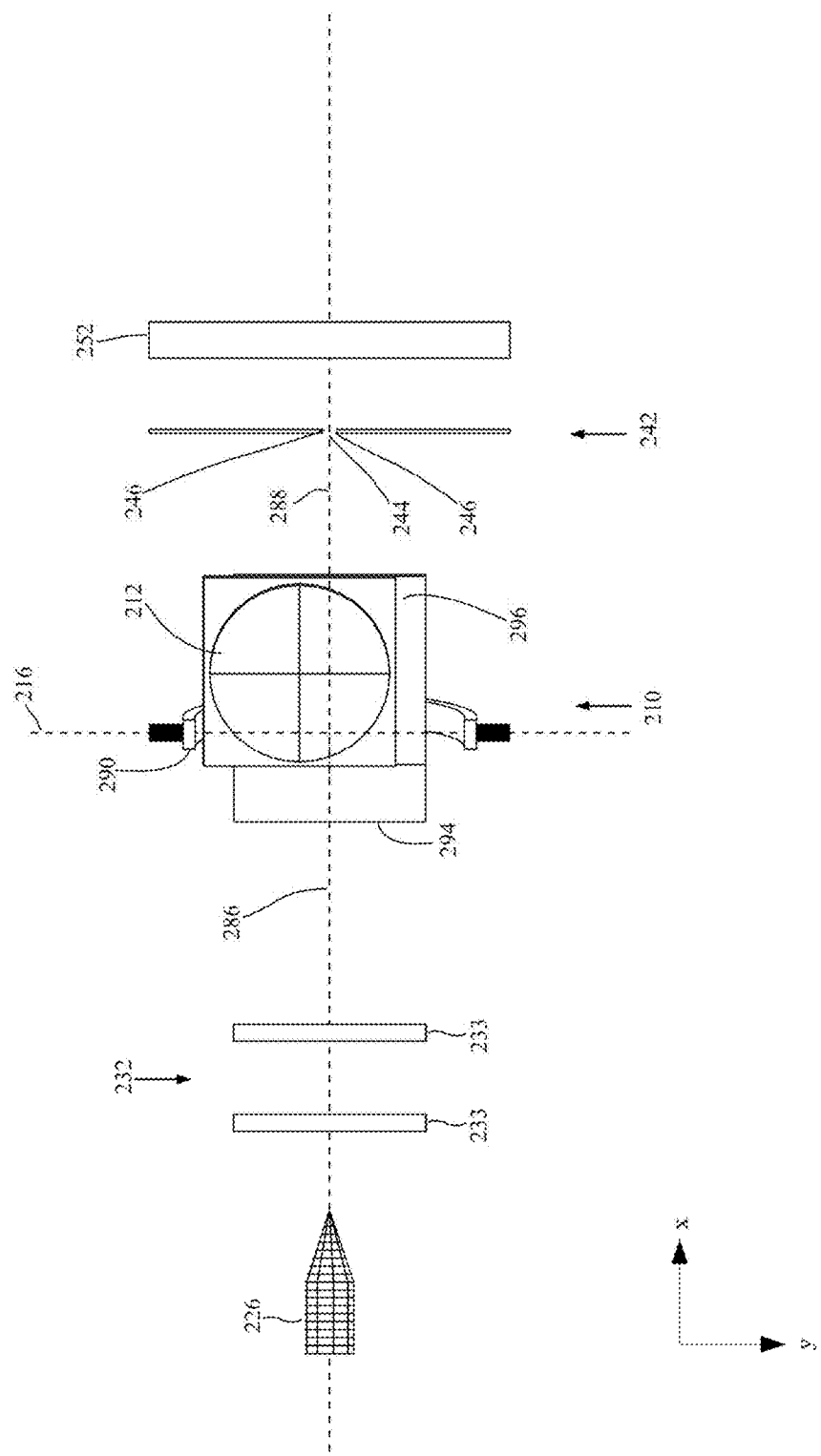
FIG. 10 shows top view in x-y plane of embodiment of electron reflectometer pseudo-periodic with rotation axes and electron directions shown.
Figure 11:
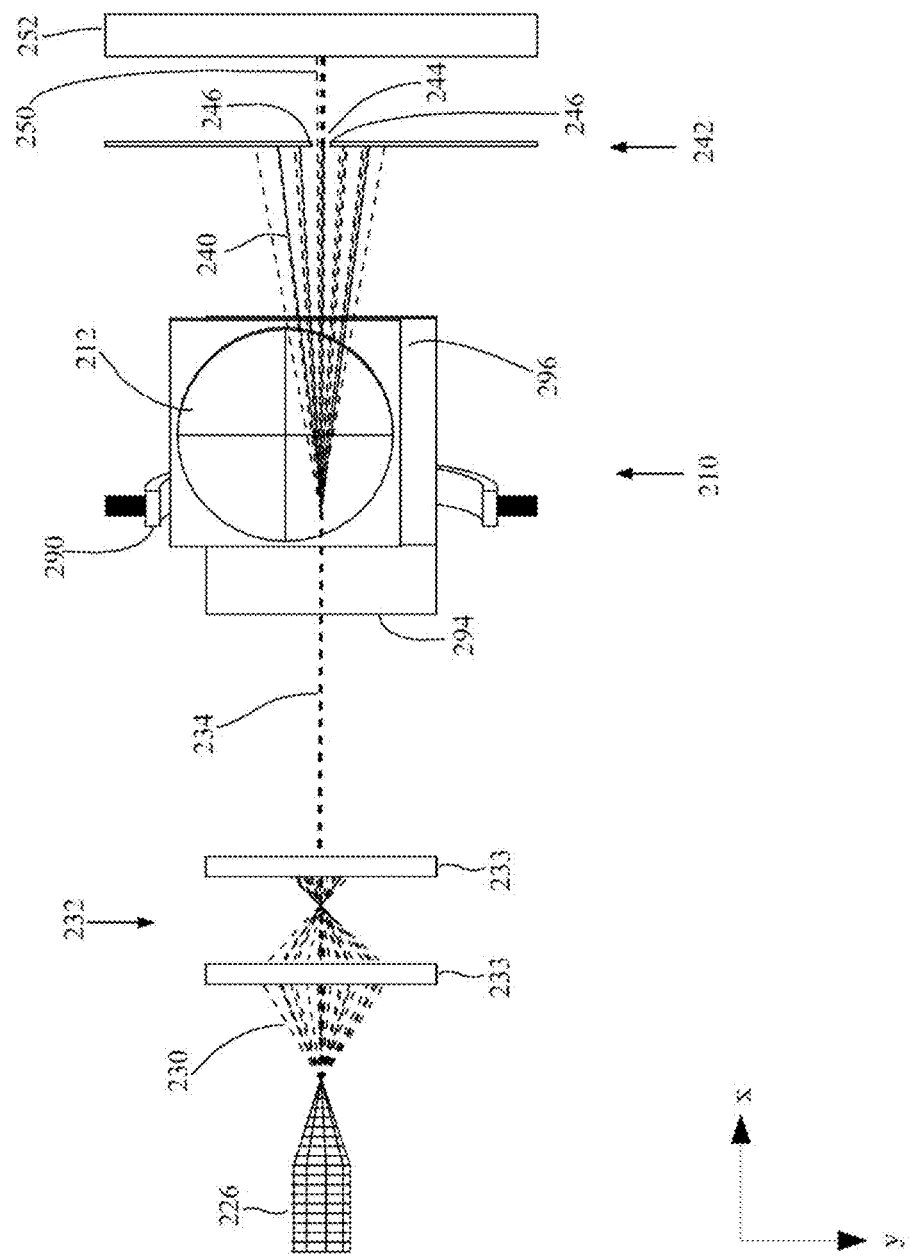
FIG. 11 shows top view in x-y plane of embodiment of electron reflectometer pseudo-periodic with electrons shown.
Figure 12:
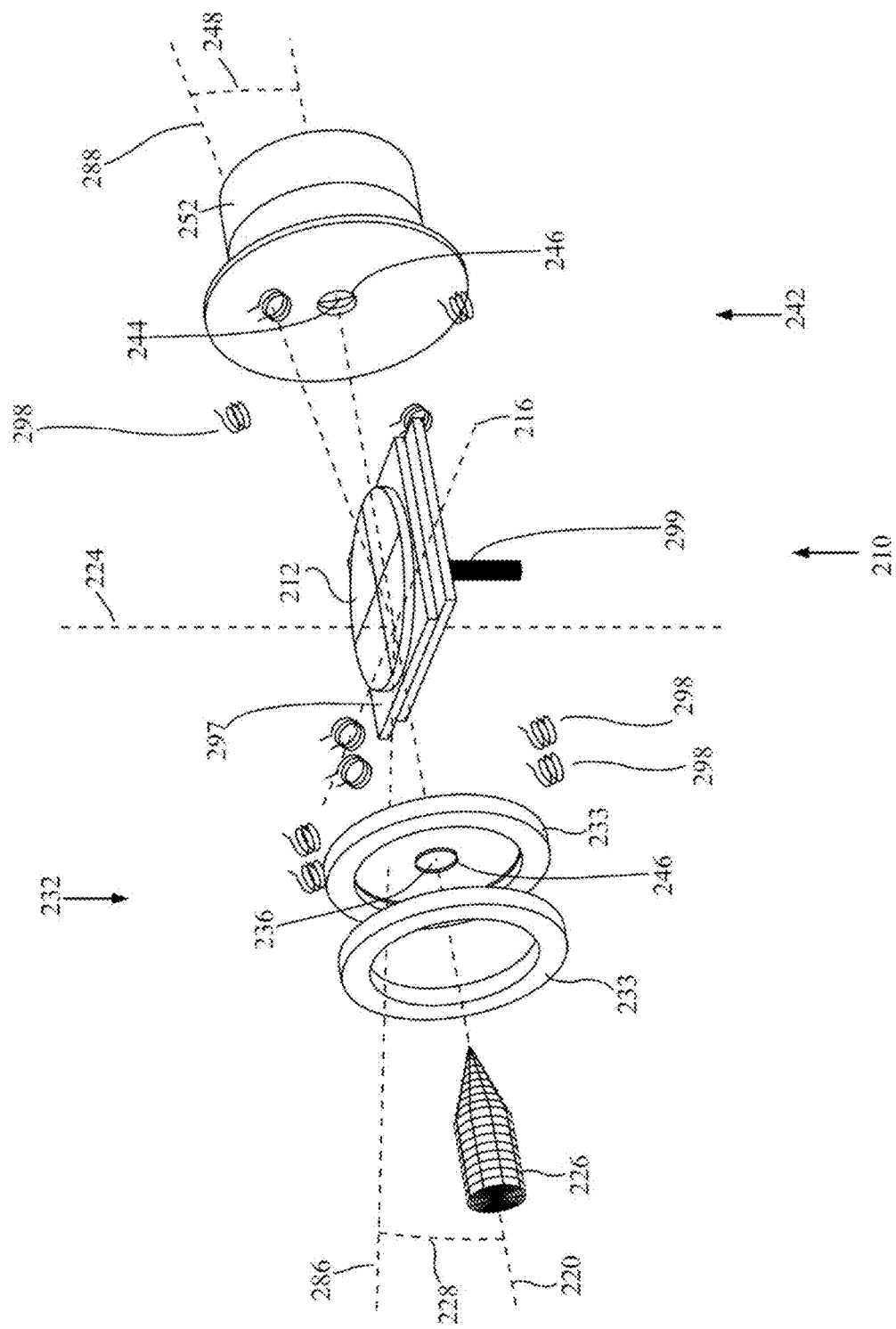
FIG. 12 shows oblique view of embodiment of electron reflectometer pseudo-periodic with rotation axes and electron directions shown.

Constructing detection collimator 242 includes with reference to FIG. 6 and FIG. 10, disposing two Pt/Ir strips with thickness of 1 mm or a little more, side-by-side and separated by the distance needed to provide detection transmission aperture 244 with detection angular width 268, which is roughly the distance from the anticipated incident footprint 265 to the anticipated detection transmission aperture 244 multiplied by the desired detection angular width 268.

Taking care that the roughness of aperture boundary wall 246 is small (<5% of the linear width of detection transmission aperture 244) will provide a more easily analyzed current of collimated reflected electrons 250.

Disposing detection collimator 242 interposed between anticipated location of sample 212 on sample stage 210 and electron detector 252 includes with regard to FIG. 6 and FIG. 10, aligning detection collimator 242 and detection transmission aperture 244 so as to receive reflected electrons 240 and produce collimated reflected electrons 250, specifically, detection collimator 242 can be disposed so that length of detection transmission aperture 244 is parallel to azimuthal axis 224 and centered about roll axis 220.

Disposing electron detector 252 to receive and detect collimated reflected electrons 250 includes placement and alignment of electron detector 252 so that it is sensitive to collimated reflected electrons 250 but not to other reflected electrons 240. Electron sensitive area of electron detector 252 can span the total anticipated range of angles of pitch rotation 214 and detection angle 248; wherein detection angle 248 is anticipated to have a range similar to range of pitch angle 238.

In an embodiment, a process for making electron reflectometer 200 with respect to FIG. 12 through FIG. 17 includes: providing a main body for environment and structural support of electron reflectometer 200; disposing source 226 on one side of main body of electron reflectometer 200; constructing and disposing source collimator 232 adjacent to source 226; constructing sample stage 210; disposing sample stage 210 interposed between source collimator 232 and anticipated detection collimator 242; constructing detection collimator 242 from scanning coils 298 and electron-opaque material so as to provide detection angular width 268 and enable operation of electron reflectometer scan modes; disposing detection collimator 242 interposed between anticipated location of sample 212 on sample stage 210 and electron detector 252; disposing electron detector 252 to receive and detect collimated reflected electrons 250.

Providing main body of electron reflectometer 200 includes constructing or customizing a vacuum chamber to provide mean-free-path of electrons large enough so that electron scattering away from sample does not render measurement impossible. An electron mean-free-path comparable to or larger than the distance from source 226 to detector 252 should be sufficient. Main body includes ports to allow power and signal wires to reach the same, and to allow insertion and removal of sample 212 and mounting of sample 212 upon sample stage 210 and includes attachment points for other elements of electron reflectometer.

Disposing source 226 on main body of electron reflectometer 200 includes providing fixed or movable attachments and ensuring that source collimator 232 can receive source electrons 230. In embodiment depicted in FIG. 12-FIG. 17, source 226 provides source electrons 230 mostly directed about roll axis 220 that is coincident with central axis of source collimator 232.

Constructing and disposing source collimator 232 adjacent to source 226 includes disposing electron lenses 233 with optical axes aligned about roll axis 220, disposing source transmission aperture 236 centered on and perpendicular to roll axis 220 so as to allow electrons to travel down roll axis and scanning coils 298 centered around roll axis 220 so as to deflect electrons off of roll axis 220 onto and travelling along a potential incident direction 286.

Constructing sample stage 210 includes disposing a stable support for a range of intended type of sample 212. Sample stage 210 can include linear stage 297 for repositioning of sample 212 perpendicular to plane through roll axis 220 and azimuthal axis 224. Sample stage 210 can include additional positioning and goniometric capability to help with calibration including height adjustment stage 299, pitch goniometer 290, roll goniometer 292 and rotation stage 294.

Disposing sample stage 210 interposed between source collimator 232 and anticipated detection collimator 242 includes placement and alignment of sample stage 210 so that anticipated mounted sample 212 can receive from source collimator 232 incident electrons 234 traveling along incident direction 286 at point of common intersection of pitch axis 216, roll axis 220 and azimuthal axis 224 and allow the normal direction to the sample surface 274 to be aligned with azimuthal axis 224. It is contemplated that small misplacements and misalignments can be corrected during calibration using adjustments to source collimator 232 and detection collimator 242, and that large variations in shape and size of sample 212 can be accommodated if sample stage 210 is more versatile and includes height adjustment stage, linear x-y stages and goniometers.

Constructing and disposing detection collimator 242 interposed between anticipated location of sample 212 on sample stage 210 and electron detector 252 includes disposing a scanning coil 298 centered around and aligned with roll axis 220, and disposing an electron-opaque barrier, for example a Pt/Ir strip or plate with thickness of 1 mm, that has a detection transmission aperture 244. The size and shape of detection transmission aperture 244 can be chosen to provide a desired detection angular width 268. For a circular detection transmission aperture 244, a desired detection angular width 268 will result from choosing an aperture diameter equal to the desired detection angular width 268 multiplied by the distance between the detection transmission aperture 244 and the anticipated incident footprint 265. If adjustments to the source collimator 232 are used to shift the position of the incident footprint 265, the detection angular width 268 will vary accordingly. The actual detection angular width can vary with detection angle 248.

Figure 13:
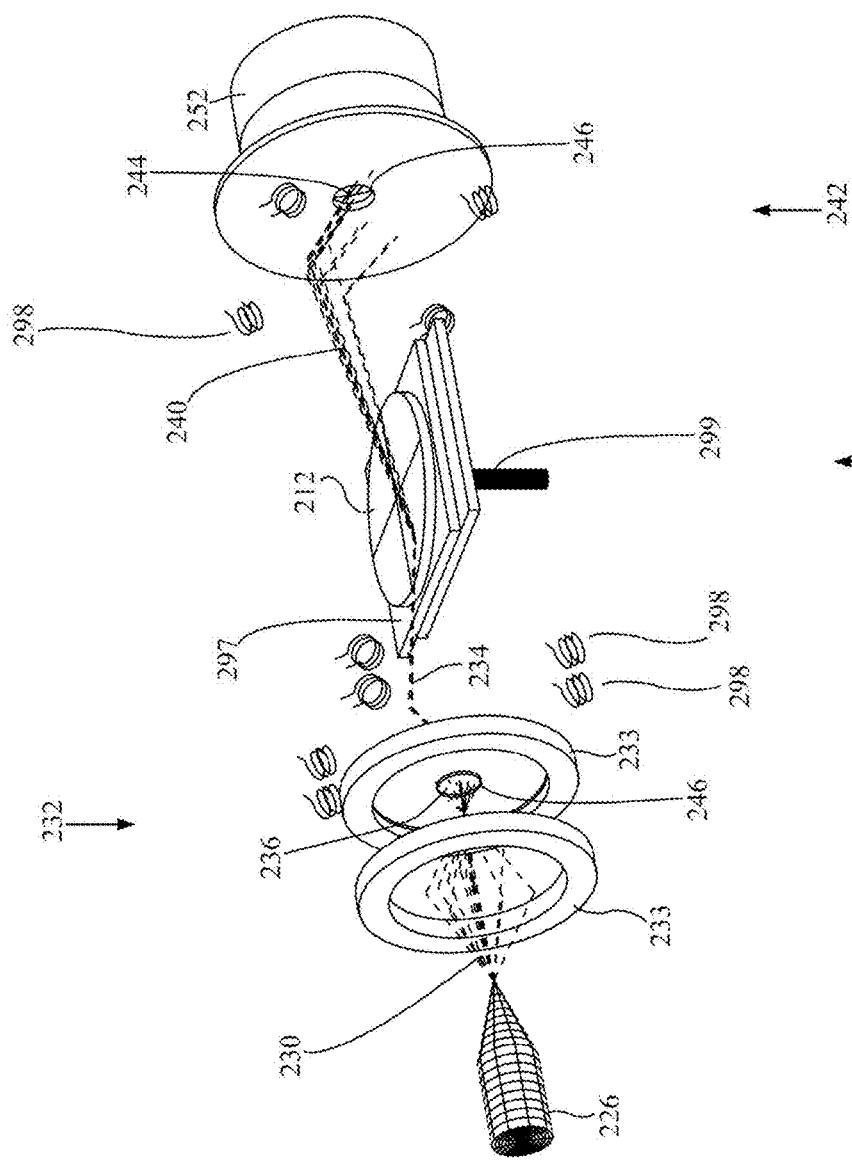
FIG. 13 shows oblique view of embodiment of electron reflectometer pseudo-periodic with electrons shown.
Figure 14:
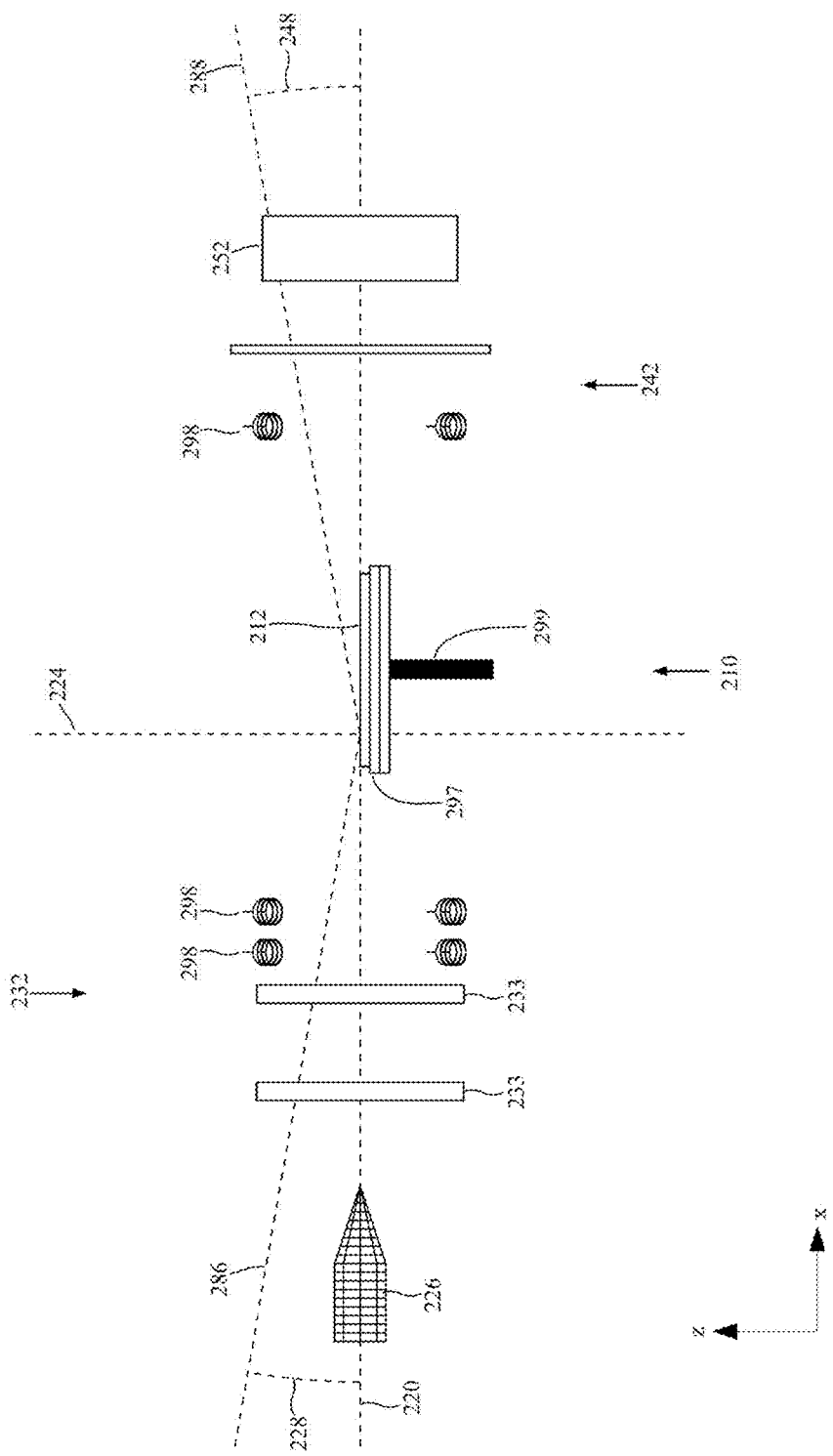
FIG. 14 shows side view in x-z plane of embodiment of electron reflectometer pseudo-periodic with rotation axes and electron directions shown.
Figure 15:
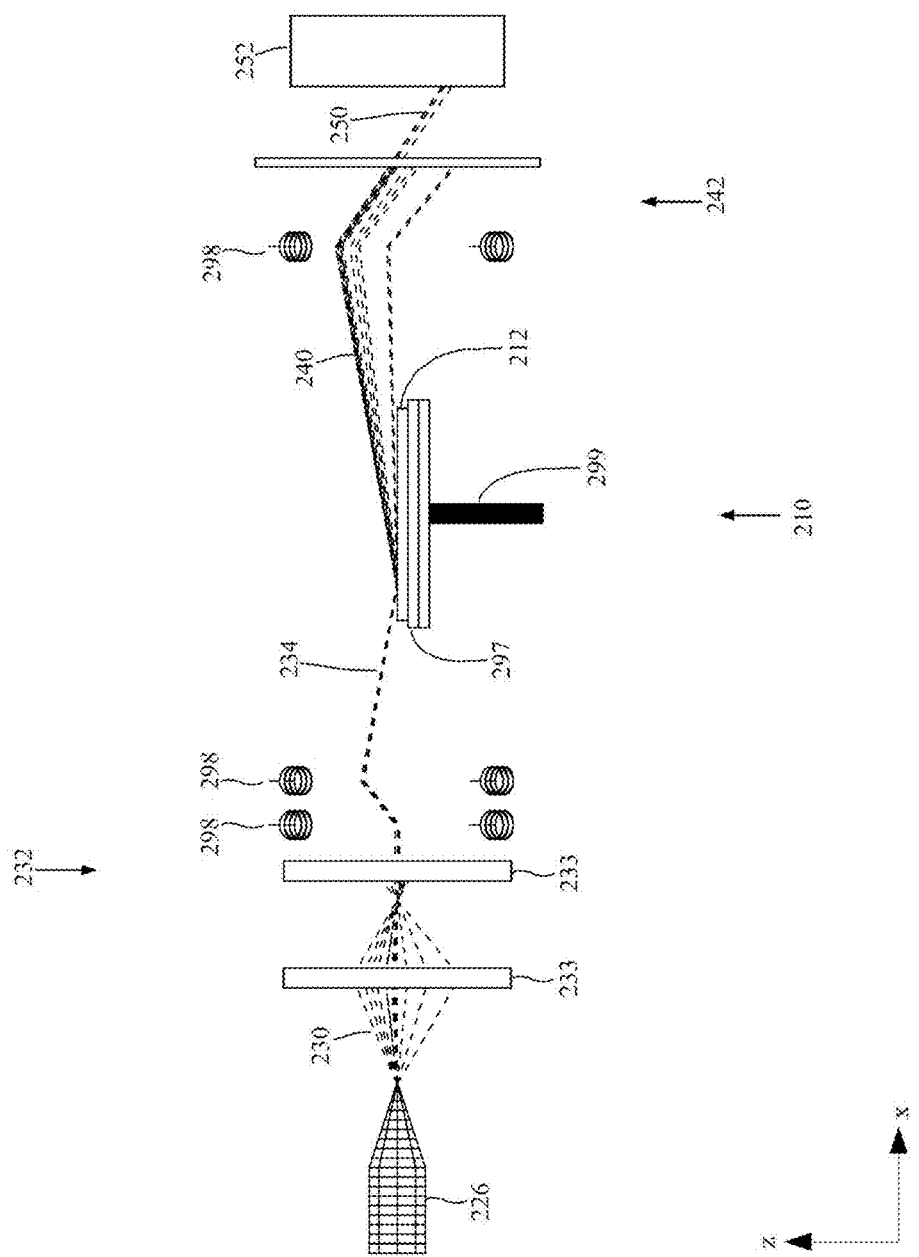
FIG. 15 shows side view in x-z plane of embodiment of electron reflectometer pseudo-periodic with electrons shown.
Figure 16:
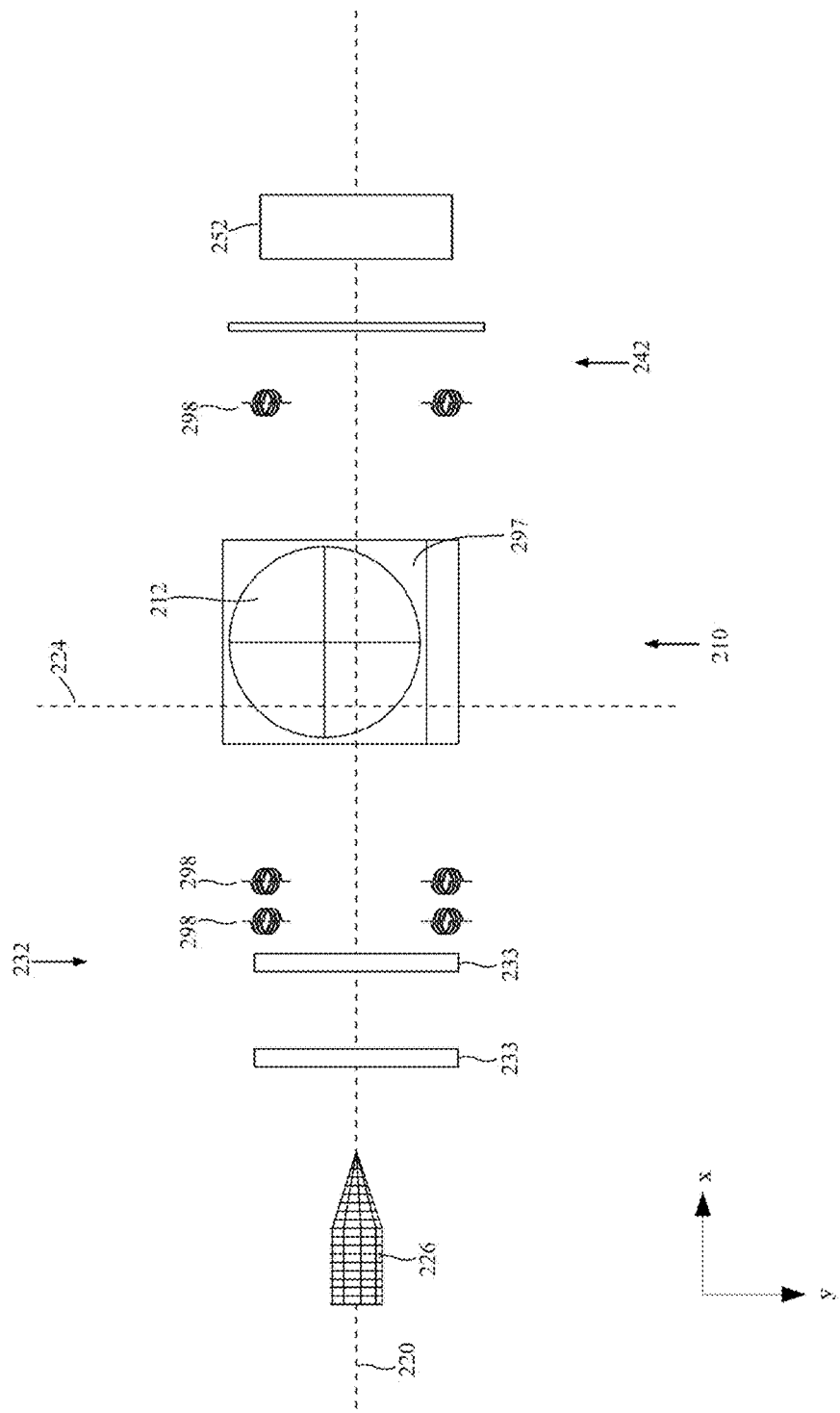
FIG. 16 shows top view in x-y plane of embodiment of electron reflectometer pseudo-periodic with rotation axes and electron directions shown.
Figure 17:
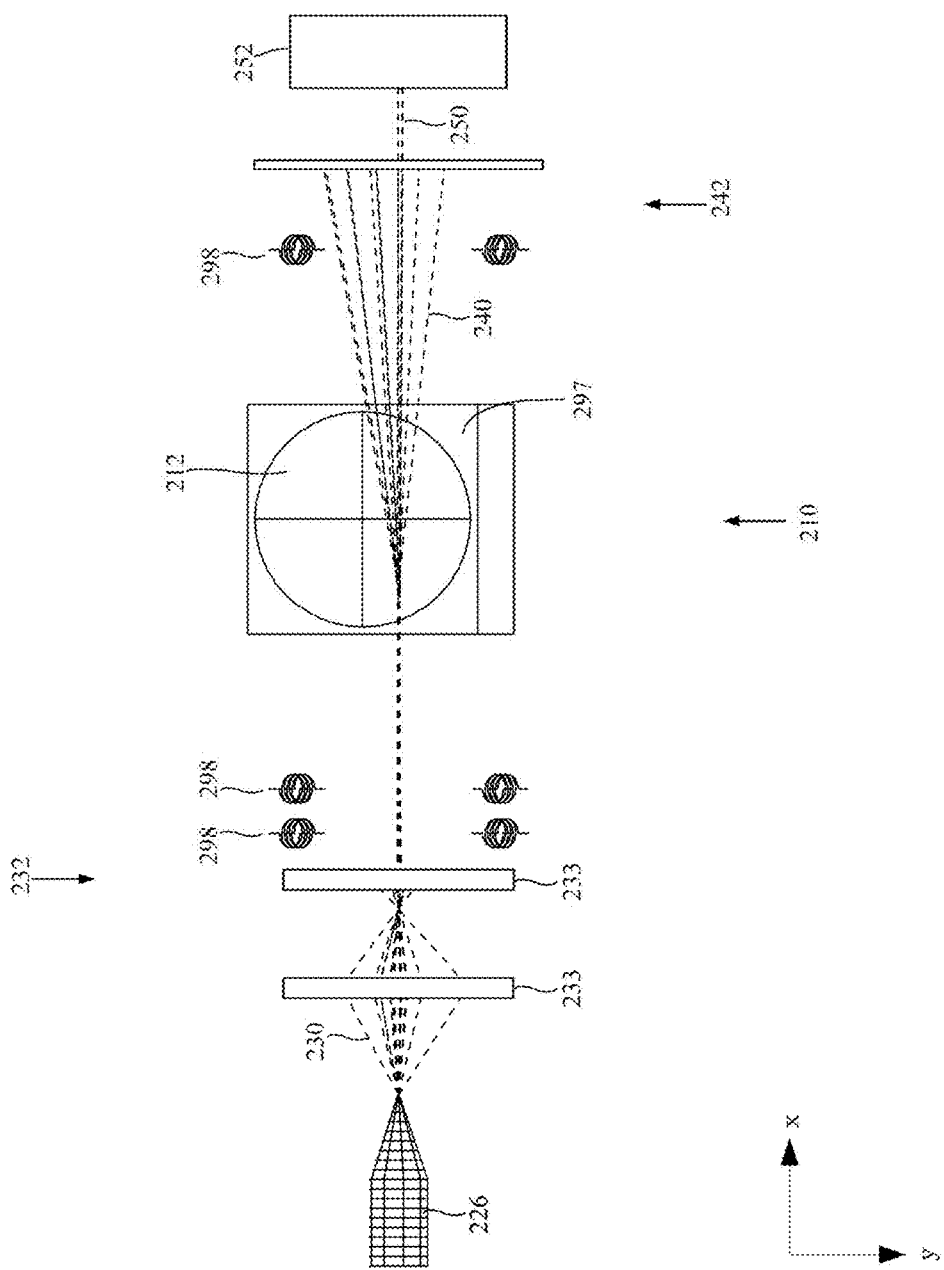
FIG. 17 shows top view in x-y plane of embodiment of electron reflectometer pseudo-periodic with electrons shown.

Disposing electron detector 252 to receive and detect collimated reflected electrons 250 includes placement and alignment of electron detector 252 so that it is sensitive to collimated reflected electrons 250 but not to other reflected electrons 240. FIG. 13, FIG. 15 and FIG. 17 serve as a guide. Electron sensitive area of electron detector 252 is aligned to receive electrons transmitted through detection transmission aperture 244. Since electrons will be deflected off the roll axis 220 by scanning coils 298, electron sensitive area of electron detector 252 is large enough to accommodate anticipated variation of detection direction 288 and consequent variations in trajectories of collimated reflected electrons 250.

Electron reflectometer 200 has numerous beneficial uses, including performing shape metrology. In an embodiment, a process for performing shape metrology of sample 212 includes: producing source electrons 230; receiving, by source collimator 232, source electrons 230 from source 226; collimating, by source collimator 232, source electrons 230; producing, by source collimator 232, incident electrons 234; subjecting sample 212 disposed on sample stage 210 to incident electrons 234 from source collimator 232; producing reflected electrons 240 from incident electrons 234 in response to receipt of incident electrons 234 by sample 212; collimating, by detection collimator 242, reflected electrons 240; producing, by detection collimator 242, collimated reflected electrons 250; and receiving, by electron detector 252, collimated reflected electrons 250 from detection collimator 242 to perform shape metrology of sample 212.

The process for performing shape metrology can include disposing sample 212 on sample stage 210 so that incident footprint 265 will coincide with region of sample surface 274 to be measured.

Disposing sample 212 on sample stage 210 can include: securing sample 212 to sample stage 210 in desired position, and can include securing sample 212 to sample stage 210 and moving sample linearly with linear x-y stage 296, linear stage 297, height adjustment stage 299 and by linear motion of a multiaxial stage. Moreover, disposing sample 212 on sample stage 210 can include calibration of pitch angle 238, roll angle 258, and azimuthal angle 262 via pitch rotation 214 of sample 212 about pitch axis 216, roll rotation 218 of sample 212 about roll axis 220, and azimuthal rotation 222 of sample 212 about azimuthal axis 224, and a combination of rotations. Disposing a Sample 212 with a well-defined sample surface 274 that has a well-defined normal direction, for example an etched semiconductor wafer, can include calibration of pitch angle 238 and roll angle 258 so that both angles are 0° when the plane through pitch axis 216 and roll axis 220 is parallel to sample surface 274, and azimuthal axis 224 is perpendicular to surface normal. If sample 212 has an obvious azimuthal orientation such as an etched grating or a crystallographic direction, sample 212 can be disposed so that the grating lines or crystallographic direction are parallel to roll axis 220. For this azimuthal orientation of sample 212, azimuthal angle 262 can be recalibrated to 0°.

The process for performing shape metrology can include providing environment such as vacuum to provide mean-free-path of electrons long enough that additional electron scattering in gas or air does not distort or obscure angular dependence of electron reflectivity. An electron mean-free-path comparable to or larger than the distance from source 226 to detector 252 should be sufficient.

In the process for performing shape metrology, producing source electrons 230 includes adjusting source current and accelerating voltage to provide source electrons 230 with selected kinetic energy. Kinetic energy of source electrons 230 can be selected from the range of 100 eV to 100 keV, specifically from 1 keV to 80 keV and more specifically from 5 keV to 30 keV. Selection of kinetic energy can be performed by considering effect of energy on electron wavelength and consequent effects on angular resolutions and ranges of angular scans, vulnerability of sample 212 to damage by electrical current and energy, effect on anticipated reflectivity of sample 212 using Fresnel's law of reflectivity as a guide, and by effect of kinetic energy on electron mean-free-path in provided environment.

The process for performing shape metrology can include adjusting and redisposing source 226 and source collimator 232, and selecting or changing source transmission aperture 236 to provide desired incident direction 286, incident angle 288, incident angular width 264, and incident footprint 265. Adjustments to source 226 and source collimator 232 can be performed at beginning of process for performing shape metrology and can be performed throughout process.

Adjusting and redisposing source 226 and source collimator 232 to provide desired incident direction 286, incident angle 228, incident angular width 264 and incident footprint 265 can include movably disposing source 226, movably disposing source collimator 232, adjusting focal length of an electron lens 233, and adjusting deflection from a scanning coil 298. Electron lens 233 can be adjusted to: magnify and de-magnify electron optical image of electron source 226 and to move electron optical image of electron source 226 along incident direction 286 to provide incident footprint 265 and incident angular width 264. A scanning coil 298 can be adjusted to move incident footprint 265 on sample surface 274 and to calibrate incident direction 286 and incident angle 228.

The process for performing shape metrology can include adjusting electron detector 252, detection collimator 242 and selecting or changing detection transmission aperture 244 to provide desired detection direction 288, detection angular width 268 and to receive reflected electrons 240 from measured area of sample surface 274. Adjustments of electron detector 252 and detection collimator 242 can be performed at start of process for performing shape metrology and can be performed throughout process. In some cases, detection transmission aperture 244 can be changed throughout process for performing shape metrology as well; for example, when detection transmission aperture 244 is provided by selecting and deselecting pixels on a camera.

Adjusting electron detector 252 and detection collimator 242 to provide desired incident angular width 264 and incident footprint 265 can include movably disposing source 226, movably disposing source collimator 232, adjusting deflection from a scanning coil 298.

The process for performing shape metrology can include performing pitch rotation 214 about pitch axis 216 through pitch angle 238, roll rotation 218 through roll angle 258 about roll axis 220 using, and azimuthal rotation 222 through azimuthal angle 262 about azimuthal axis 224, or a combination of the foregoing rotations.

Pitch rotation 214 can be active pitch rotation, passive pitch rotation, or a combination thereof.

Active pitch rotation can include rotating sample 212, roll axis 220 and azimuthal axis 224 through pitch angle 238 about pitch axis 216.

Passive pitch rotation can include rotating incident direction 286 and detection direction 288 through pitch angle 238 in the opposite sense of pitch rotation 214 about pitch axis 216.

Combination of active pitch rotation and passive pitch rotation can include a combination whose angles sum to a total that is equal to pitch angle 238.

Roll rotation 218 can be active roll rotation, passive roll rotation, or a combination thereof.

Active roll rotation can include rotating sample 212 and azimuthal axis 224 through roll angle 258 about roll axis 220.

Passive roll rotation can include rotating incident direction 286, detection direction 288 and pitch axis 216 through roll angle 258 in the opposite sense about roll axis 220.

Combination of active roll rotation and passive roll rotation can include a combination whose angles sum to a total that is equal to roll angle 258.

Azimuthal rotation 222 can be active azimuthal rotation, passive azimuthal rotation, or a combination thereof.

Active azimuthal rotation can include rotating sample 212 and through azimuthal angle 262 about azimuthal axis 224.

Passive azimuthal rotation can include rotating incident direction 286, detection direction 288, pitch axis 216 and roll axis 220 through azimuthal angle 262 in the opposite sense about azimuthal axis 224.

Combination of active azimuthal rotation and passive azimuthal rotation can include a combination whose angles sum to a total that is equal to azimuthal angle 262.

The process for performing shape metrology can include changing incident direction 286 to provide incident angle 228 between incident direction 286 plane through pitch axis 216 and roll axis 220 by performing pitch rotation 214, adjusting or movably disposing source collimator 232, adjusting or movably disposing source 226, or by combination thereof.

The process for performing shape metrology can include changing detection direction 288 to provide detection angle 248 between detection direction 288 and plane through pitch axis 216 and roll axis 220 by performing pitch rotation 214, adjusting or movably disposing detection collimator 242, adjusting or movably disposing electron detector 252, or combination thereof.

The process for performing shape metrology can include receiving, by energy filter 254, collimated reflected electrons 250 from detection collimator 242; filtering collimated reflected electrons 250 based on an energy of collimated reflected electrons 250; and communicating collimated reflected electrons 250 to electron detector 252 from energy filter 254 based on the energy of collimated reflected electrons 250.

The process for performing shape metrology can include receiving, by energy filter 254, reflected electrons 240; filtering reflected electrons 240 based on an energy of reflected electrons 240; and communicating reflected electrons 240 to detection collimator 242 from energy filter 254 based on the energy of reflected electrons 240.

The process for performing shape metrology can include receiving, by analyzer 260, detector signal 256 from electron detector 252; analyzing detector signal 256; and determining surface morphology 270 of sample 212 based on detector signal 256.

Also, the process for performing shape metrology can include performing reflection angle scans, azimuthal scans, roll scans and rolled reflection angle scans.

Performing reflection angle scans includes disposing and adjusting sample 212 and sample stage 210 to roll angle 258 of 0° and a selected azimuthal angle 262, usually also 0°. Incident angle 228 and detection angle 248 are adjusted to the same value and then varied together through a series of angles that can lie within the range from 0° to 5°, specifically from 0.1° to 2°, more specifically from 0.2° to 1° in discrete steps or in a ramp. Current of collimated reflected electrons 250 is measured and recorded for each step or throughout continuous ramp. Oscillations in current with scan angle can be analyzed to provide quantitative description of surface morphology 270. It is contemplated that current during reflection angle scan will oscillate with scan angle at a rate inversely related to height H of surface morphology 270, and that these oscillations are distorted, shifted, suppressed, and enhanced by the presence of other features such as undercut 291, top-rounding 293, and differences in sidewall angle 295. Discrete step size or slow ramp rate can be chosen to obtain a clear low-noise measurement for desired angular resolution of scan. Desired angular resolution can be determined by consideration of anticipated surface morphology 270. Larger height variations of surface morphology 270 requires finer angular resolution either to measure height or to get a clear measurement of fine features. As a heuristic guide, angular resolution expressed in radians should be no coarser than and preferably much less than the ratio of electron wavelength to height H. To illustrate, a reflection angle scan using electrons with wavelength of 12 pm on a grating with height H of 10 nm would require an angular resolution finer than 0.6 mrad or 0.034°. Additionally, maximum angle of reflection angle scan can be chosen according to desired feature sensitivity. Larger scan angles, i.e. larger incident angle 228 and detection angle 248 will provide sensitivity to smaller features. It is anticipated that sensitivity to features of small size like undercut 291 will be enhanced if the range of pitch scan angles expressed in radians includes the ratio of electron wavelength to desired feature sensitivity. For example, to detect an undercut of diameter 1 nm with electrons of wavelength 12 pm, it is recommended to include the angle 6 mrad or 0.34° in a reflection angle scan. Moreover, decreasing incident angular width 264, detection angular width 268 or both to required angular resolution will provide measured currents of collimated reflected electrons 250 vs. scan angle that are easier to analyze.

Performing azimuthal scans includes disposing and adjusting sample 212 and sample stage 210 to roll angle 258 of 0°. Incident angle 228 and detection angle 248 are adjusted to the same chosen value of constant reflection angle. While measuring current of collimated reflected electrons 250, azimuthal rotation 222 is then performed by varying the azimuthal angle 262 through a series of angles that can lie within the range the range from −5° to 5°, specifically from −2° to 2°, more specifically from −1° to 1° in discrete steps or in a ramp. Oscillations in current with azimuthal angle 262 can be analyzed to provide quantitative description of surface morphology 270. It is contemplated that current during azimuthal scan will oscillate at a rate inversely related to pitch P of surface morphology 270, and that these oscillations are distorted, shifted, enhanced, and suppressed, by the presence of other features such as undercut 291, top-rounding 293 and differences in sidewall angle 295. The reflection angle of azimuthal scan can be chosen in a manner to provide sensitivity to desired features. As a heuristic guide to choosing reflection angle for azimuthal scan, it is anticipated that for an azimuthal scan to be sensitive to undercut 291, the reflection angle of the azimuthal scan expressed in radians is recommended to be larger than half the ratio of incident electron wavelength to desired size sensitivity. For example, it is recommended that to detect an undercut 291 with diameter as small as 1 nm with an azimuthal scan of electrons with wavelength 12 pm, the reflection angle for an azimuthal should be larger than 6 mrad or 0.34°. Discrete step size or slow ramp rate can be chosen to obtain a clear low-noise measurement for desired angular resolution of scan. Desired angular resolution can be determined by consideration of anticipated surface morphology 270. Larger values of pitch P of surface morphology 270 are best measured with finer angular resolution either to measure pitch P or to get a clear measurement of other features of surface morphology 270. As a heuristic guide, it is recommended that angular resolution expressed in radians be no coarser than and preferably much less than the ratio of electron wavelength to pitch P of surface morphology 270. To illustrate, an azimuthal scan using electrons with wavelength of 12 pm on a grating with pitch P of 100 nm would be most easily analyzed if the azimuthal scan is performed with an angular resolution finer than 0.12 mrad or 0.0069°. Moreover, decreasing incident angular width 264, detection angular width 268 or both to required angular resolution will provide measured currents of collimated reflected electrons 250 vs. scan angle that are easier to analyze.

Performing roll scans includes disposing and adjusting sample 212 and sample stage 210 to azimuthal angle 262 of 0°. Incident angle 228 and detection angle 248 are adjusted to the same chosen value of constant reflection angle. While measuring current of collimated reflected electrons 250, roll rotation 218 is then performed by varying the roll angle 258 through a series of angles that can lie within the range the range from −90° to 90°, specifically from −60° to 60°, more specifically from −30° to 30° in discrete steps or in a ramp. Oscillations in current with roll angle 258 can be analyzed to provide quantitative description of surface morphology 270. It is contemplated that current during roll scan oscillate with roll angle 258 at a rate inversely effected by pitch P and height H of surface morphology 270, and that these oscillations are distorted, shifted, enhanced, and suppressed by the presence of other features such as undercut 291, top-rounding 293 and differences in sidewall angle 295. The reflection angle of roll scan can be chosen in a manner to provide sensitivity to desired features. Higher reflection angles are anticipated to provide greater sensitivity to smaller features while lower reflection angles may provide clearer measurement of sidewall angle 295. Discrete step size or slow ramp rate can be chosen to obtain a clear low-noise measurement for desired angular resolution of scan. As a heuristic guide, it is anticipated that angular precision of measurement of sidewall angle 295 will be limited by angular resolution of roll scan. Moreover, varying incident angular width 264, detection angular width 268, or both will tend to emphasize and deemphasize effects of various features of surface morphology 270.

Performing rolled reflection angle scans includes disposing and adjusting sample 212 and sample stage 210 to selected roll angle 258 and an azimuthal angle 262 of 0°. Incident angle 228 and detection angle 248 are adjusted to the same value and then varied together through a series of angles that can lie within the range from 0° to 5°, specifically from 0.1° to 2°, more specifically from 0.2° to 1° in discrete steps or in a ramp. Current of collimated reflected electrons 250 is measured and recorded for each step or throughout continuous ramp. Oscillations in current with scan angle can be analyzed to provide quantitative description of surface morphology 270. Selected roll angle 258 can lie in range of angles from −90° to 90°, specifically from −60° to 60°, more specifically from −30° to 30°. It is contemplated that current during rolled reflection angle scan will oscillate with scan angle at a rate inversely related to height H and pitch P of surface morphology 270, and that these oscillations will be distorted and shifted by the presence of other features such as undercut 291, top-rounding 293 and differences in sidewall angle 295. Discrete step size or slow ramp rate can be chosen to obtain a clear low-noise measurement for desired angular resolution of scan. Desired angular resolution can be determined by consideration of anticipated surface morphology 270. As a heuristic guide, angular resolution expressed in radians should be no coarser than and preferably much less than the ratio of electron wavelength to height H; should be no coarser than and preferably much less than the ratio of electron wavelength to pitch P. Moreover, decreasing incident angular width 264, detection angular width 268 or both to required angular resolution will provide measured currents of collimated reflected electrons 250 vs. scan angle that are easier to analyze.

In the process for performing shape metrology, collimating, by source collimator 232, source electrons 230 includes directing source electrons 230 toward intended area of sample 212 along incident direction 286 to provide incident footprint 265, and providing incident angular width 264. Source electrons 230 can be directed by use of electron optical elements that can include an electron lens 233, a scanning coil 298 and a source transmission aperture 236. Providing incident angular width 264 can include using a source transmission aperture 236 to block or capture electrons that deviate from incident direction 286 by more than incident angular width 264.

In the process for performing shape metrology, producing, by source collimator 232, incident electrons 234 includes allowing electrons that are directed toward intended area of sample 212 along incident direction 286 to pass through collimator.

In the process for performing shape metrology, subjecting sample 212 disposed on sample stage 210 to incident electrons 234 from source collimator 232 includes ensuring sample 212 is correctly positioned and oriented and that incident footprint 265 is coincident with intended area to be measured of sample surface 274.

In the process for performing shape metrology, producing reflected electrons 240 from incident electrons 234 in response to receipt of incident electrons 234 by sample 212 includes specular reflection of incident electrons 234 from sample surface 274 and surface members 278, diffuse reflection of incident electrons 234 from sample surface 274 and surface members 278, diffraction of incident electrons 234 by sample surface 274 and surface members 278, elastic scattering of incident electrons 234 from sample 212, inelastic scattering if incident electron 234 from sample 212.

In the process for performing shape metrology, collimating, by detection collimator 242, reflected electrons 240 includes preventing detection of those reflected electrons 240 whose trajectories deviate from detection direction 288 by more than detection angular width 268 and allowing those reflected electrons 240 whose trajectories are aligned with detection direction 288 as specified by detection angular width 268 to be detected as collimated reflected electrons 250. Collimating reflected electrons 240 can include blocking some reflected electrons 240 while allowing other reflected electrons 240 to pass through a detection transmission aperture 244 to become collimated reflected electrons 250, redirecting reflected electrons 240 in combination with use of a detection transmission aperture 244, for example, by use of a scanning coil 298, and by virtual means such as selectively keeping and discarding data from a pixelated area detector (e.g. as in FIG. 5) in data post processing or combination thereof.

In the process for performing shape metrology, producing, by detection collimator 242, collimated reflected electrons 250 includes selecting which reflected electrons 240 will be detected by electron detector 252 and which will not by creating an actual beam of collimated reflected electrons 250 that will be detected by electron detector 252, or by immediately detecting selected reflected electrons 240 as collimated reflected electrons 250 in combination with electron detector 252, for example selectively discarding data from a pixelated area detector in post processing.

In the process for performing shape metrology, filtering collimated reflected electrons 250 based on an energy of collimated reflected electrons 250 includes high pass filtering (selecting those electrons that have a kinetic energy higher than a specified value), low pass filtering (selecting electrons with a kinetic energy lower than a specified value) and band pass filtering (selecting electrons with kinetic energies falling within a specified range). High pass filtering can be used to reduce contributions to measured current of collimated reflected electrons 250 from inelastically scattered electrons and secondary elections. It is anticipated that measurements from high-pass filtered electrons will be most easily analyzed and modeled and have enhanced signal to noise ratio. Low pass filtering can be used to isolate electrons that have been produced by inelastic scattering allowing calibration of background and can be sensitive to material composition. Band pass filtering can provide more detailed information from inelastic scattering processes.

High pass filtering, low pass filtering and band pass filtering can include use of a retarding mesh, a magnetic prism, a slit-filter located at a dispersion plane in combination with other electron optics, and the like.

In the process for performing shape metrology, communicating collimated reflected electrons 250 to electron detector 252 from energy filter 254 based on the energy of collimated reflected electrons 250 includes directing filtered electrons toward sensitive area of electron detector 252.

In the process for performing shape metrology, filtering reflected electrons 240 based on an energy of reflected electrons 240 includes high pass filtering (selecting those electrons that have a kinetic energy higher than a specified value), low pass filtering (selecting electrons with a kinetic energy lower than a specified value) and band pass filtering (selecting electrons with kinetic energies falling within a specified range). High pass filtering can be used to reduce contributions of reflected electrons 240 from inelastically scattered electrons and secondary elections and ultimately to reduce their contribution to collimated reflected electron 250 current. It is anticipated that measurements from high-pass filtered electrons will be most easily analyzed and modeled and have enhanced signal to noise ratio. Low pass filtering can be used to isolate electrons that have been produced by inelastic scattering allowing calibration of background and can be sensitive to material composition. Band pass filtering can provide more detailed information from inelastic scattering processes.

In the process for performing shape metrology, analyzing detector signal 256 includes tabulating and plotting signal vs independent variables including reflection angle, pitch angle 238, roll angle 258, and azimuthal angle 262, typically by digital means.

In the process for performing shape metrology, determining surface morphology 270 of sample 212 based on detector signal 256 comparing dependence of signal 256 with measurements from reference samples, with simulations, with analytic calculations, noting periodicity and anomalies in data. For example, with reference to FIG. 26-FIG. 29, detector signal 256 has different dependence on azimuthal angle 262 when sample 212 has undercut 291, top-rounding 293 and differences in sidewall angle 295. This difference can be described as a change in ratios of peak intensity, phase shift of oscillations where peaks and troughs occur at different values of an independent variable or have different separations, and even suppressed oscillation peaks. In addition to noting qualitative features and performing graphical analysis, determining surface morphology 270 can include numerical regression to real-time simulations and to simulations performed in post-processing and to cataloged simulations, depending on time requirements and available resources, and machine learning-based methods.

Electron reflectometer 200 has numerous advantageous and beneficial properties. In an aspect, electron reflectometer 200 provides the ability to measure surface morphology 270 of a sample 212 with a combination of features that set it apart from other methods including strong interaction of with sample surface 274, tunable size of incident footprint 265, sensitivity to height H, width W, and other aspects of surface morphology 270 including sensitivity to subtle geometric features, requires little to no sample preparation, non-destructive measurement, ability to choose from a variety of electron sources and detectors, and ability to perform shape metrology by measuring current of collimated reflected electrons 250 for each disposition of sample 212 and incident direction 286, as opposed to measuring a profile of scattering intensity through a range of solid-angles for each disposition of sample 212 and incident direction 286.

Strong interaction with sample surface 274 is due to large scattering cross-sections of electrons when contrasted with x-rays and neutrons and large Fresnel reflectivity. Although frequently more difficult to analyze quantitatively, scattering from strongly interacting particles is predominantly sensitive to geometry avoiding obfuscation by other properties of sample 212 such as composition. The dependence of some measurement methods on multiple properties can be referred to as a parameter covariance problem.

Tunable size of incident footprint 265 including linear dimension ranges from widths of 20 µm to 100 µm allowing measurement that have statistically significant sampling and small spectral resolution while still small enough to be used on test structures that are size-constrained because of manufacturing considerations such as in the electronics industry where test-structures must frequently be limited to sacrificed areas such as dicing lanes. Moreover, tunable size of incident footprint 265 allows current density of incident electrons 234 to be modified without changing the total electron current, so that current density can be adjusted for considerations such as fragility and charging of sample 212.

Sensitivity to height H results from interference between electrons reflected by the base of the sample surface 274 and surface members 278, and electrons reflected by the top of the sample surface 274 and surface members 278. This interference is possible because of the strong Fresnel reflectivity of incident electrons 234 at glancing angles and large electron scattering cross-sections.

Sensitivity to width W results from strong Fresnel reflectivity of incident electrons 234 at glancing angles and large electron scattering cross-sections resulting in dynamic scattering, also called multiple scattering.

Figure 21:
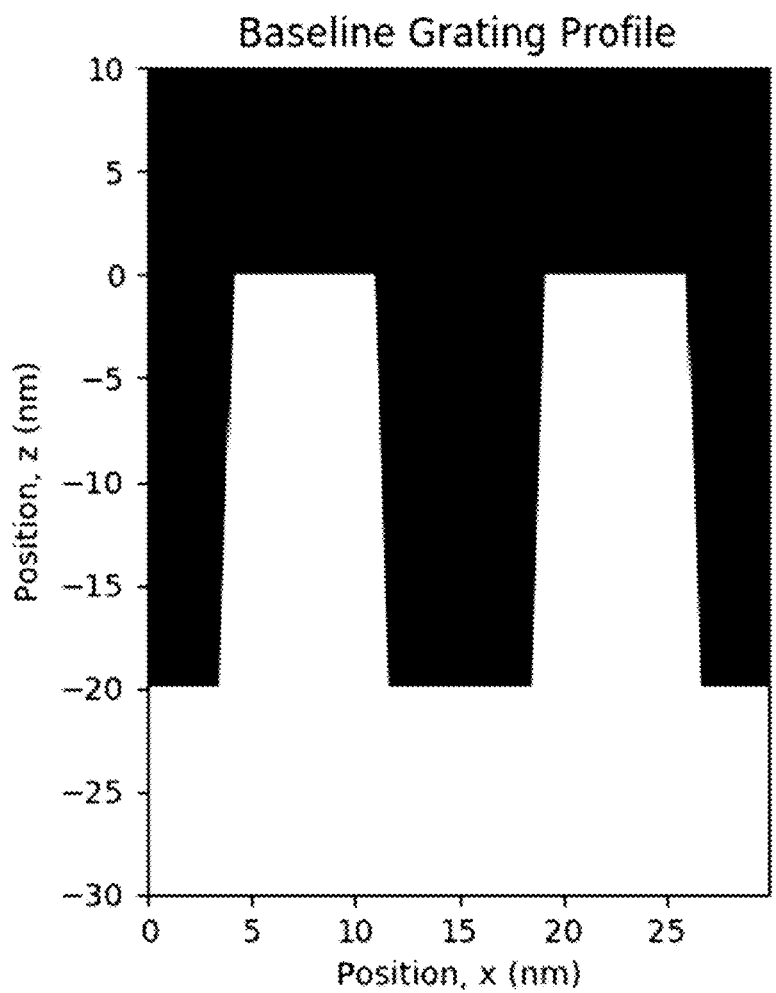
FIG. 21 shows a cross-sectional view of a sample having a surface morphology pseudo-periodic with a baseline grating profile in Y-Z plane.
Figure 22:
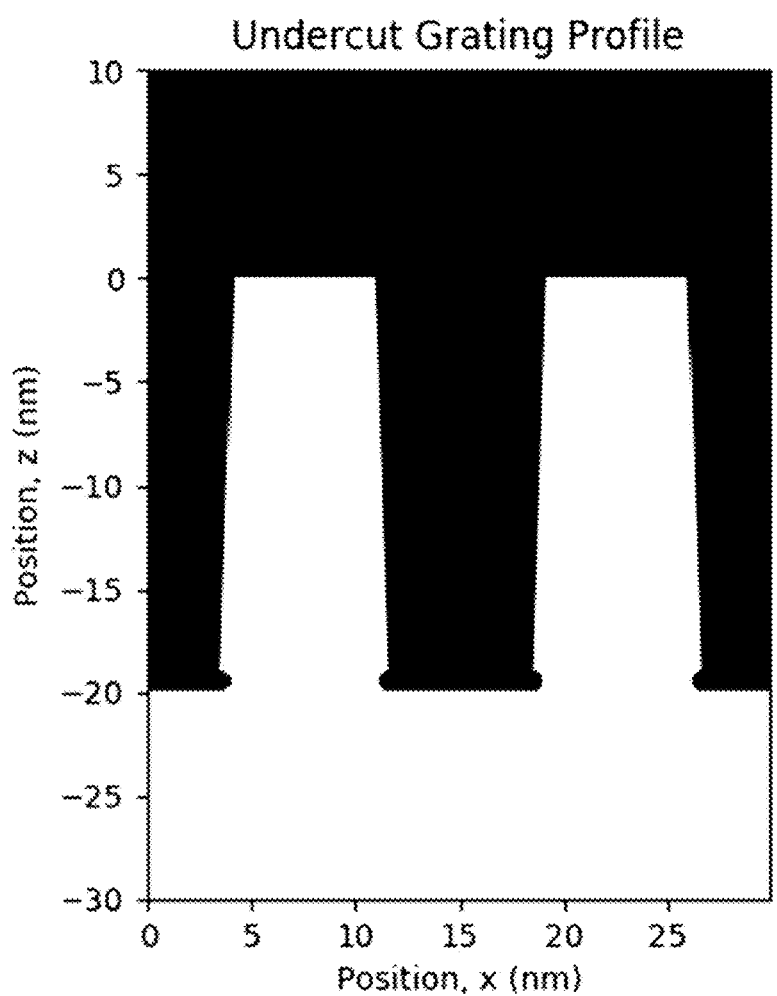
FIG. 22 shows a cross-sectional view of a sample having a surface morphology pseudo-periodic with an undercut pseudo-periodic grating profile Y-Z plane.
Figure 23:
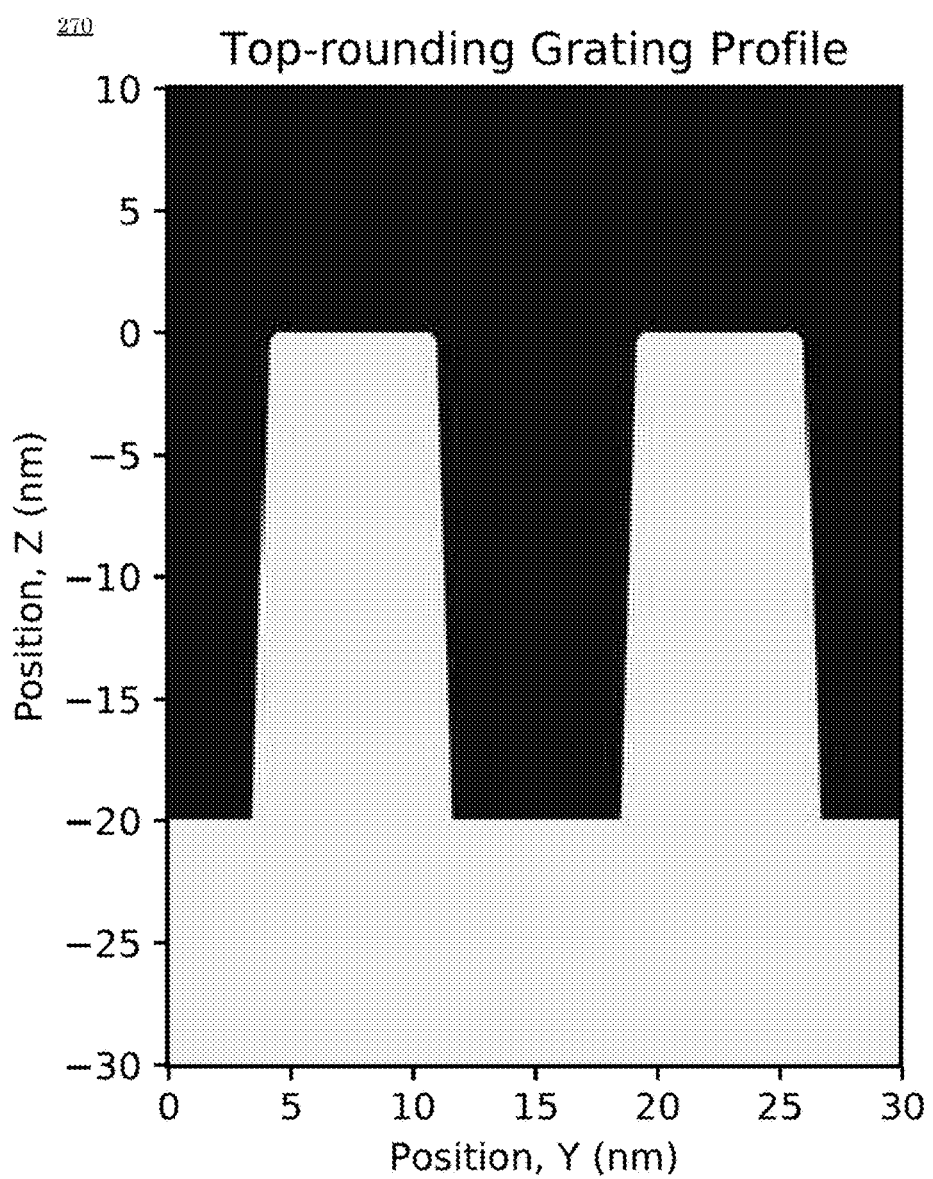
FIG. 23 shows a cross-sectional view of a sample having a surface morphology pseudo-periodic with a top-rounding pseudo-periodic grating profile Y-Z plane.
Figure 24:
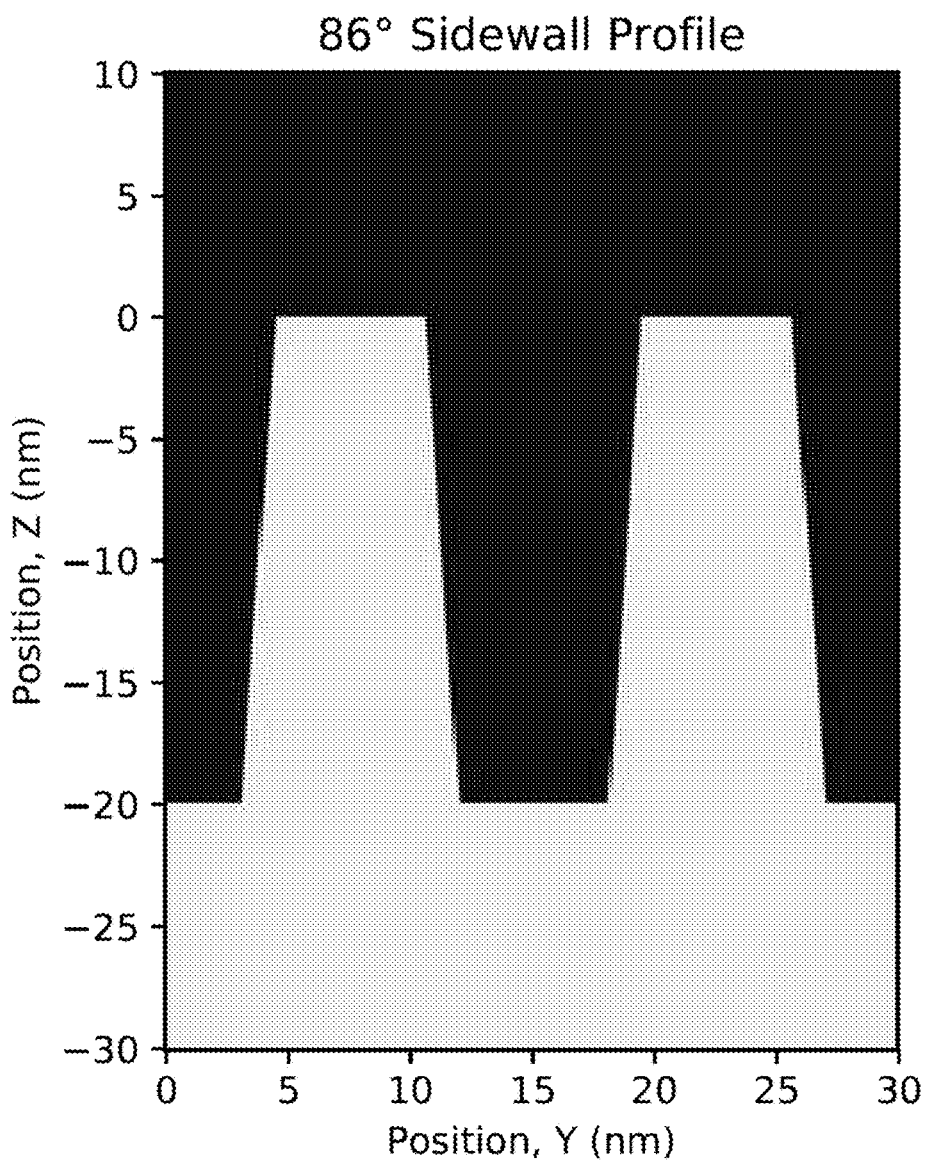
FIG. 24 shows a cross-sectional view of a sample having a surface morphology pseudo-periodic with an 86° sidewall angle pseudo-periodic profile Y-Z plane.
Figure 25:
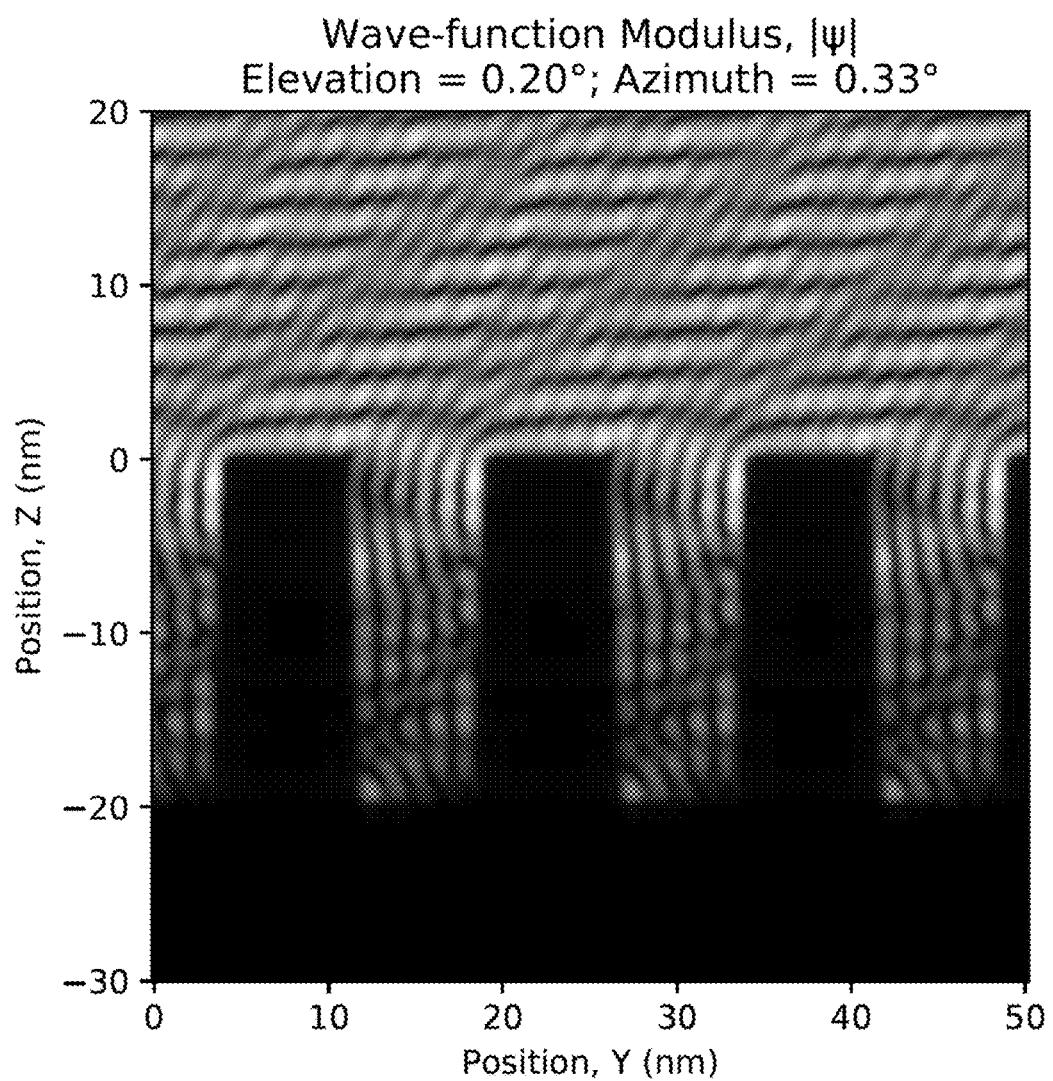
FIG. 25 shows an intensity plot of a simulated electron wave-function modulus in Y-Z-plane as incident electrons are reflected.
Figure 26:
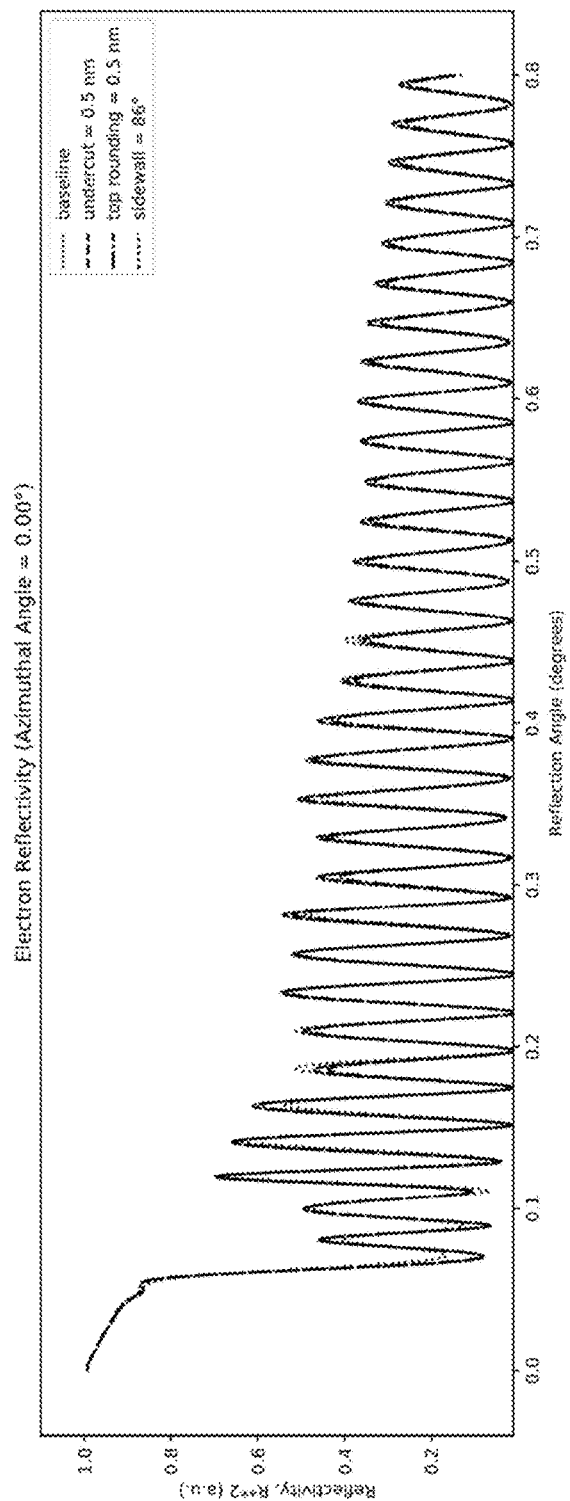
FIG. 26 shows a graph of reflectivity versus reflection angle at azimuthal angle pseudo-periodic of 0°.
Figure 27:
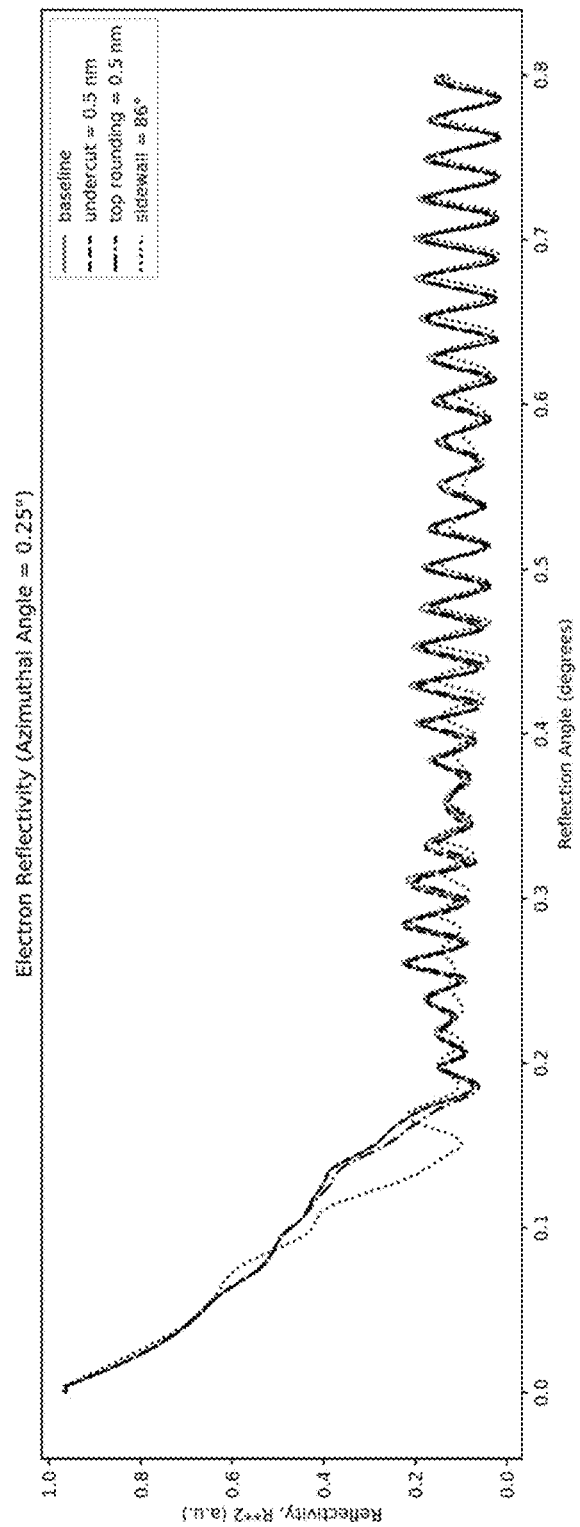
FIG. 27 shows a graph of reflectivity versus reflection angle at azimuthal angle pseudo-periodic of 0.25°.
Figure 28:
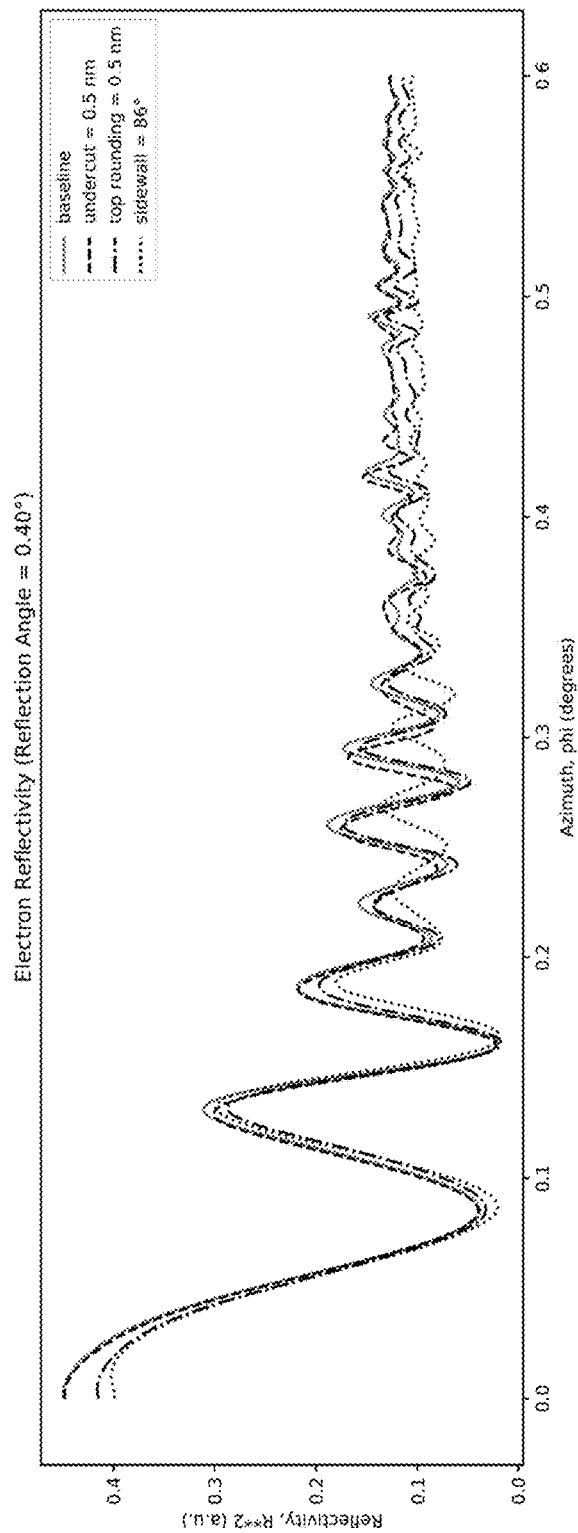
FIG. 28 shows a graph of reflectivity versus azimuthal angle pseudo-periodic at reflection angle of 0.40°.
Figure 29:
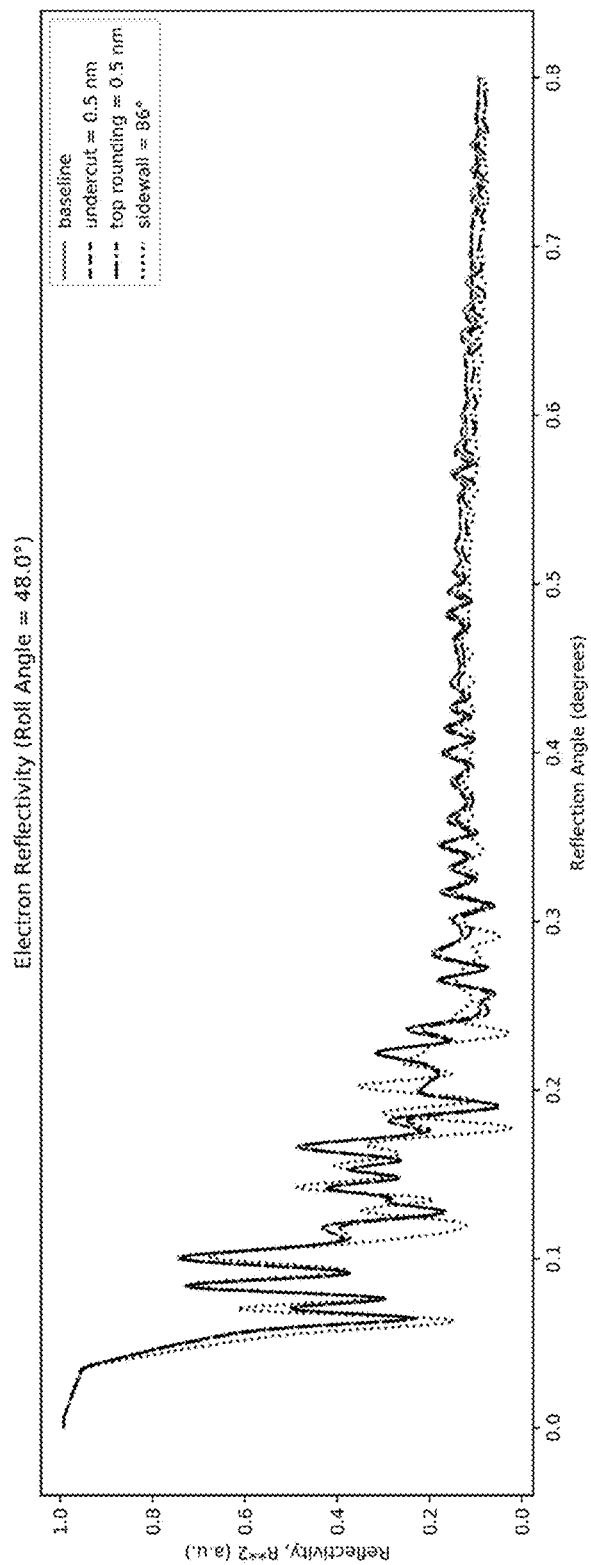
FIG. 29 shows a graph of reflectivity versus reflection angle at a roll angle pseudo-periodic of 48.0°.

Sensitivity to subtle geometric features includes sensitivity to undercut 291, top-rounding 293, sidewall angle 295, and the like, and is depicted in FIG. 21-FIG. 29 that describe a quantum simulation of dynamic reflection of electrons from a grating. FIG. 21 depicts an ideal grating cross-section that has no undercut 291, no top-rounding 293 and a sidewall angle 295 of 88°. FIG. 22 depicts an almost ideal cross-section but with an undercut 291 of radius 0.5 nm. FIG. 23 depicts an almost ideal cross-section but with top-rounding 293 of radius 0.5 nm. FIG. 24 depicts an almost ideal cross-section but with a 2° reduction in sidewall angle 295. FIG. 25 shows a simulated electron wavefunction of the type that occurs during reflection of incident electrons 234 to produce reflected electrons 240. FIG. 26-FIG. 29 show simulated electron reflectivity vs angle for various scan modes performed on gratings with four cross-sections show in FIG. 21-FIG. 25. FIG. 26 shows simulated current of collimated reflected electrons 250 vs. reflection angle data resulting from a reflection angle scan at azimuthal angle 262 of 0°. FIG. 27 shows simulated current of collimated reflected electrons 250 vs. reflection angle data resulting from a reflection angle scan at azimuthal angle 262 of 0.25°. FIG. 28 shows current of collimated reflected electrons 250 vs. azimuthal angle 262 during an azimuthal scan for a reflection angle of 0.40°. FIG. 29 shows current of collimated reflected electrons 250 vs. reflection angle during a rolled reflection angle scan for a roll angle 258 of 48.0°.

Requires little to no sample preparation because electron reflectometer 200 reflects electrons from sample surface 274. Electron reflectometer 200 can measure surface morphology 270 under the same conditions required for Scanning Electron Microscopy. It is contemplated that test structures can be measured while on whole wafers with instrument dimensions and range of motion of sample stage 210 providing the only limits on size of sample 212.

Non-destructive measurements result from qualities of electron reflectometry including: requires little or no sample preparation, currents and current densities of incidence electrons 234 can be adjusted, that Fresnel reflection of electrons at glancing angles deposits little energy in sample 212 because of effects that include: penetration by electrons takes place primarily by evanescent non-propagating waves over distances less than a few nm, and many inelastic scattering phenomena result in virtual scattering processes that enhance reflectivity of sample surface 274 instead of real inelastic scattering that deposits energy in sample 212 possibly causing damage.

Ability to perform shape metrology by measuring current of collimated reflected electrons 250 for each disposition of sample 212 and incident direction 286, as opposed to measuring a profile of scattering intensity through a range of solid-angles for each disposition of sample 212 and incident direction 286 allows the measurement process to be simplified in contrast to other mentioned electron scattering methods such as RSAES. Other measurement processes require hyperfine angular resolution to determine diffraction spot locations while electron reflectometer 200 requires only the current of the collimated reflected electrons 250; the direction of specular reflection is easy to predict as it depends on only the normal to the sample surface 274 and the incident angle 228; it is independent of sample surface morphology 270. Moreover, measurement of a single current greatly reduces requirements of angular resolution and enables a choice of electron detector 252 for specific needs such as low current density and allows a choice between an area detector and a point detector depending on applications. For the most demanding applications where one would like a combination of fine angular resolution, small incident footprint 265 and low current density, a high-sensitivity point detector can be used to compensate for the low current of incident electrons 234 to produce a useful current measurement of collimated reflected electrons 250.

Electron reflectometer 200 advantageously and unexpectedly is capable of performing shape metrology by measuring changes in currents of collimated reflected electrons 250 that consist primarily of specularly reflected electrons, as the majority of reflected electrons 240 produced by non-specular reflection will fail to meet collimation criteria and will not contribute to the current of collimated reflected electrons 250. Shape metrology can include inferring shape of sample 212 from intensity oscillations, regression of detailed electron reflection models to experimental data, differential comparisons to baseline experimental data to detect geometric features or defects, performing statistical inferences about random and quasi-periodic surface morphology 270 including: measurement of surface roughness, density and size of adsorbed nanoparticles, and the like, and interpreting currents of collimated reflected electrons 250 with machine-learning methods.

The articles and processes herein are illustrated further by the following Examples, which are non-limiting.

EXAMPLES

In the Examples, line gratings with features in nanometers were used. The Y-axis is defined along the direction parallel to the lines, the X-axis transverse to the lines and Z-axis is the direction along the height of the gratings. In this disclosure the line grating samples are placed on the reflectometer instrument at its zero-angle position with all three rotation angles set to zero, i.e. pitch angle=0°, roll angle=0°, and azimuthal angle=0°. With this angle setting and sample placement, the sample Z-axis is along the azimuthal axis, X-axis along the roll axis and Y-axis long the pitch axis.

Example 1. Electron Reflectometry of Nanoscale Test Pattern Grating 276

With regard to FIG. 18 through FIG. 29, in example, we depict contemplated application of measurement of surface morphology 270 using electron reflectometer 200 to process refinement and quality control during nanoscale lithography. It is contemplated that a test pattern 276 grating includes long lines with lengths in the range from 10 µm to 10000 µm and with nanoscale cross-section as shown in FIG. 21. Such a grating can be produced from a Si wafer via nanoscale lithographic techniques typical in use in the semiconductor and electronics industries. In example, baseline grating profile in FIG. 21 is the hypothetically desired product of nanoscale lithography. It has a pitch (P) of 15 nm, a height (H) of 20 nm, a width (W) at half-height of 7.5 nm, and a sidewall angle 295 of 88°. Contemplated deviations from desired outcome of baseline grating profile are depicted in FIG. 22-FIG. 24. Measurement of surface morphology 270 using electron reflectometer 200, can detect even small deviations from the desired baseline grating profile, as illustrated here by simulating electron reflectometry using an electron kinetic energy of 5 keV, in various scan-modes including: reflection angle scan, azimuthal scan, and rolled reflection angle scan.

FIG. 22 depicts an undercut grating profile that differs from the baseline grating profile in FIG. 20 by virtue of having undercut 291 of grating walls 280 of radius 0.5 nm.

FIG. 23 depicts a top-rounding grating profile that differs from the baseline grating profile in FIG. 20 by virtue of having top-rounding 293 of grating walls 280 of radius 0.5 nm.

FIG. 24 depicts an 86° sidewall profile that differs from the baseline grating profile in FIG. 20 by virtue of having a sidewall angle 295 that is 2° less than the baseline value of 88°.

FIG. 25 shows an intensity plot of a simulated wave-function modulus when incident electrons 234 with kinetic energy of 5 keV impinge upon a line grating with baseline grating profile. Electron reflectometer 200 is set to have a reflection angle if 0.20°, pitch angle 238 of 0°, roll angle 258 of 0°, and an azimuthal angle of 0.33°. Even though the grating is energetically attractive to incident electrons 234, their quantum wave nature results in a very large reflectivity, and there is almost no wave penetration. The baseline grating profile is clearly visible as the electron-deficient area in FIG. 25. Small changes to the grating cross-section will distort the electron wave function changing the ratio of specularly reflected to non-specularly reflected electrons. Since specularly reflected electrons are the largest component of collimated reflected electrons 250, electron reflectometer 200 can detect this difference.

FIG. 26 shows simulated data resulting from a reflection angle scan at azimuthal angle 262 of 0° for each of the four grating profiles. Depicted reflectivity oscillations have a rate that is sensitive to grating height H.

FIG. 27 depicts simulated data resulting from a reflection angle scan at azimuthal angle 262 of 0.25° for each of the four grating profiles. Depicted reflectivity oscillations are less clearly related to grating height H, but show greater sensitivity to the four different grating profiles, illustrating how electron-reflectometer 200 can detect small shape variations in grating profiles.

FIG. 28 depicts simulated data resulting from an azimuthal scan at reflection angle of 0.40° for each of the four grating profiles. Depicted reflectivity oscillations have angular frequency that varies inversely with line grating pitch P. Moreover reflectivities of each of the four grating profiles differ from one another illustrating how electron-reflectometer 200 can detect small shape variations in grating profiles.

FIG. 29 depicts simulated data resulting from a rolled reflection angle scan at roll angle of 48.0° for each of the four grating profiles. Depicted reflectivity oscillations are less clearly related to coarse geometric descriptions such as height H or pitch P, but they demonstrates how electron-reflectometer 200 can distinguish between grating profiles even when changes are small.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. An electron reflectometer comprising:
a sample stage that:
receives a sample comprising a sample surface;
disposes the sample in a position to be analyzed;
moves the sample surface to be positioned perpendicular to an azimuthal axis and coincident at a point of common intersection of a pitch axis, roll axis, and azimuthal axis;
provides a pitch rotation through a pitch angle to the sample about a pitch axis;
provides a roll rotation through a roll angle to the sample about a roll axis, the pitch axis being perpendicular to and independent of the roll axis; and
provides an azimuthal rotation through an azimuthal angle to the sample about an azimuthal axis,
such that the sample can be rotated into a measurement position;
a source moveably disposed at an incident angle with respect to the sample stage and that produces source electrons directed toward the sample;
a source collimator interposed between the source and the sample stage and that:
receives the source electrons;
collimates the source electrons; and
produces incident electrons from the source electrons in response to collimating the source electrons,
the source collimator comprising an electron lens and source transmission aperture having an incident angular width from 0° to 5° and that provides incident electrons along an incident direction at incident angle providing an incident footprint of impinging electrons on sample surface at the point of common intersection with pitch axis, roll axis and azimuthal axis, with incident angle being adjustable from 0° to 5° relative to the plane through the pitch axis and the roll axis and incident footprint having length and width controllable via source collimator;
a detection collimator disposed at a detection angle with respect to the sample stage and that:
receives reflected electrons that are reflected by the sample and produced from the incident electrons;
collimates the reflected electrons; and
produces collimated reflected electrons from the reflected electrons in response to collimating the reflected electrons,
the detection collimator comprising a detection transmission aperture having a detection angular width from 0.002° to 5°, and the detection angle being adjustable from 0° to 5° relative to a plane through the pitch axis and the roll axis; and
an electron detector that receives the collimated reflected electrons, the electron detector being disposed at the detection angle and with the detection collimator interposed between the sample stage and the electron detector.

2. The electron reflectometer of claim 1, further comprising an energy filter that:
receives the collimated reflected electrons from the detection collimator;
filters the collimated reflected electrons based on an energy of the collimated reflected electrons; and
communicates the collimated reflected electrons to the electron detector based on the energy of the collimated reflected electrons.

3. The electron reflectometer of claim 1, further comprising an energy filter that:
receives the reflected electrons from the sample;
filters the reflected electrons based on an energy of the reflected electrons; and
communicates the reflected electrons to the detection collimator based on the energy of the reflected electrons.

4. The electron reflectometer of claim 1, further comprising an analyzer that:
receives a detector signal from the electron detector;
analyzes the detector signal; and
determines a surface morphology of the sample.

5. The electron reflectometer of claim 1, further comprising the sample.

6. The electron reflectometer of claim 1, wherein the reflected electrons and the collimated reflected electrons independently comprise:
elastically scatted electrons, inelastically scatted electrons, specularly reflected electrons, non-specularly reflected electrons, diffracted electrons, secondary electrons, or a combination comprising at least one of the foregoing types of reflected electrons.

7. A process for performing shape metrology of a sample with the electron reflectometer of claim 1, the process comprising:
producing the source electrons;
receiving, by the source collimator, the source electrons from the source;
collimating, by the source collimator, the source electrons;
producing, by the source collimator, the incident electrons from the source electrons;
subjecting the sample disposed on the sample stage to the incident electrons from the source collimator with electrons impinging upon the sample surface within an incident footprint that has length and width controllable by source collimator;
producing reflected electrons from the incident electrons in response to receipt of the incident electrons by the sample;
collimating, by the detection collimator, the reflected electrons;
producing, by the detection collimator, the collimated reflected electrons; and
receiving, by the electron detector, the collimated reflected electrons from the detection collimator to perform shape metrology of the sample.

8. The process of claim 7, further comprising disposing the sample on the sample stage.

9. The process of claim 8, further comprising disposing the sample with sample surface perpendicular to azimuthal axis and coincident with point of common intersection of all three rotation axes: pitch axis, roll axis, and azimuthal axis.

10. The process of claim 8, further comprising rotating the sample into a position to be analyzed.

11. The process of claim 10, wherein rotating the sample comprises:
performing a pitch rotation through a pitch angle about a pitch axis;
performing a roll rotation through a roll angle about a roll axis;
performing an azimuthal rotation through an azimuthal angle about an azimuthal axis; or a combination comprising at least one of the foregoing rotations.

12. The process of claim 11, further comprising sequentially or continuously scanning through at least one rotation selected from the pitch rotation, the roll rotation, and the azimuthal rotation while keeping the fixed at optimum values a rotation selected from the pitch rotation, the roll rotation, and the azimuthal rotation to enhance sensitivity to geometric a feature that includes top-rounding, undercut, sidewall angle, or roughness.

13. The process of claim 7, further comprising rotating the incident direction through the incident angle.

14. The process of claim 7, further comprising rotating the detection direction through the detection angle.

15. The process of claim 7, further comprising:
receiving, by an energy filter, the collimated reflected electrons from the detection collimator;
filtering the collimated reflected electrons based on an energy of the collimated reflected electrons; and
communicating the collimated reflected electrons to the electron detector from the energy filter based on the energy of the collimated reflected electrons.

16. The process of claim 7, further comprising:
receiving, by an energy filter, the reflected electrons from the sample;
filtering the reflected electrons based on an energy of the reflected electrons; and
communicating the reflected electrons to the detection collimator from the energy filter based on the energy of the reflected electrons.

17. The process of claim 7, further comprising:
receiving, by an analyzer, a detector signal from the electron detector;
analyzing the detector signal; and
determining a surface morphology of the sample based on the detector signal.

* * * * *